(12) United States Patent
Sung et al.

(10) Patent No.: US 11,095,021 B2
(45) Date of Patent: Aug. 17, 2021

(54) WEARABLE DEVICE INCLUDING MUTLI-BAND ANTENNA

(71) Applicant: Samsung Electronics Co., Ltd., Gyeonggi-do (KR)

(72) Inventors: Sang Bong Sung, Gyeonggi-do (KR); Woo Suk Kang, Seoul (KR); Se Woong Kim, Gyeongsangnam-do (KR); Chae Up Yoo, Seoul (KR); Jae Bong Chun, Gyeonggi-do (KR)

(73) Assignee: Samsung Electronics Co., Ltd

( * ) Notice: Subject to any disclaimer, the term of this patent is extended or adjusted under 35 U.S.C. 154(b) by 454 days.

(21) Appl. No.: 15/684,588

(22) Filed: Aug. 23, 2017

(65) Prior Publication Data

US 2018/0062249 A1    Mar. 1, 2018

(30) Foreign Application Priority Data

Aug. 29, 2016 (KR) .......................... 10-2016-0110319

(51) Int. Cl.
*H01Q 1/27* (2006.01)
*H01Q 1/42* (2006.01)
(Continued)

(52) U.S. Cl.
CPC ............. *H01Q 1/273* (2013.01); *H01Q 1/241* (2013.01); *H01Q 1/42* (2013.01); *H01Q 5/328* (2015.01);
(Continued)

(58) Field of Classification Search
CPC ........ H01Q 1/273; H01Q 5/328; H01Q 5/364; H01Q 5/50
See application file for complete search history.

(56) References Cited

U.S. PATENT DOCUMENTS 7,215,600 B1 *  5/2007  DeRosa ................. G04G 21/04
                                                    343/718
7,453,364 B2   11/2008  Sarela et al.
(Continued)

FOREIGN PATENT DOCUMENTS

CN         102280689        12/2011
CN         102893452         1/2013
(Continued)

OTHER PUBLICATIONS

International Search Report dated Nov. 3, 2017 issued in counterpart application No. PCT/KR2017/008123, 3 pages.
(Continued)

*Primary Examiner* — Dameon E Levi
*Assistant Examiner* — Jennifer F Hu
(74) *Attorney, Agent, or Firm* — The Farrell Law Firm, P.C.

(57) ABSTRACT

A wearable device including an outer housing including first, second, and side surfaces, wherein a metal frame is formed on at least a portion of the side surface, a display, a printed circuit board (PCB), a communication circuit disposed on the PCB, and a ground area provided in the PCB, wherein a metal frame is electrically connected to the communication circuit at a first point of the metal frame and is selectively connected to the ground area at a second point of the metal frame, and wherein the communication circuit is configured to transmit and/or receive a signal in a first frequency band by a first electrical path formed if the second point is not connected to the ground area, and transmit and/or receive a signal in a second frequency band by a second electrical path formed if the second point is connected to the ground area.

7 Claims, 37 Drawing Sheets

(51) Int. Cl.
  *H01Q 1/24* (2006.01)
  *H05K 5/00* (2006.01)
  *H05K 7/14* (2006.01)
  *H01Q 5/50* (2015.01)
  *H01Q 9/42* (2006.01)
  *H01Q 5/328* (2015.01)
  *H01Q 5/35* (2015.01)
  *H01Q 5/364* (2015.01)
  *H01Q 1/48* (2006.01)
  *H01Q 1/22* (2006.01)
  *H04W 88/06* (2009.01)

(52) U.S. Cl.
  CPC ............... *H01Q 5/35* (2015.01); *H01Q 5/364* (2015.01); *H01Q 5/50* (2015.01); *H01Q 9/42* (2013.01); *H05K 5/0017* (2013.01); *H05K 7/1427* (2013.01); *H01Q 1/2266* (2013.01); *H01Q 1/48* (2013.01); *H04W 88/06* (2013.01)

(56) References Cited

U.S. PATENT DOCUMENTS

| | | | |
|---|---|---|---|
| 8,923,914 B2* | 12/2014 | Kim | H01Q 5/364 455/550.1 |
| 8,942,761 B2* | 1/2015 | Vance | H01Q 5/314 455/550.1 |
| 9,130,279 B1 | 9/2015 | Lee et al. | |
| 9,276,319 B2 | 3/2016 | Vazquez et al. | |
| 9,281,553 B2 | 3/2016 | Teal et al. | |
| 9,450,298 B2 | 9/2016 | Lee | |
| 9,722,303 B2* | 8/2017 | Hsieh | H01Q 5/364 |
| 9,768,495 B2* | 9/2017 | Standke | H01Q 9/145 |
| 10,020,572 B2* | 7/2018 | Kim | G04G 17/08 |
| 10,312,575 B2 | 6/2019 | Kim et al. | |
| 10,333,211 B2* | 6/2019 | Kim | H01Q 7/00 |
| 10,581,145 B2* | 3/2020 | Han | H01Q 9/42 |
| 2006/0011729 A1 | 1/2006 | Sarela et al. | |
| 2011/0275333 A1 | 11/2011 | Kim et al. | |
| 2012/0299785 A1* | 11/2012 | Bevelacqua | H01Q 5/328 343/702 |
| 2014/0266920 A1* | 9/2014 | Tran | H01Q 7/00 343/702 |
| 2014/0333495 A1* | 11/2014 | Vazquez | H01Q 9/42 343/745 |
| 2015/0109175 A1 | 4/2015 | Kim et al. | |
| 2015/0255855 A1 | 9/2015 | Tsai et al. | |
| 2016/0064804 A1* | 3/2016 | Kim | G04G 21/04 343/702 |
| 2016/0079656 A1 | 3/2016 | Tsai et al. | |
| 2016/0099497 A1 | 4/2016 | Lee | |
| 2016/0149290 A1 | 5/2016 | Park et al. | |
| 2016/0187857 A1* | 6/2016 | Cho | H01Q 1/273 368/47 |
| 2016/0308272 A1* | 10/2016 | Standke | H01Q 13/10 |
| 2017/0045916 A1* | 2/2017 | Kim | G06F 1/1698 |
| 2017/0048991 A1 | 2/2017 | Kim et al. | |
| 2017/0062918 A1 | 3/2017 | Hirabayashi et al. | |
| 2017/0141462 A1* | 5/2017 | Lin | H01Q 1/273 |
| 2018/0294553 A1* | 10/2018 | Lim | H01Q 1/48 |

FOREIGN PATENT DOCUMENTS

| | | |
|---|---|---|
| CN | 104143701 | 11/2014 |
| CN | 104518273 | 4/2015 |
| KR | 10-2016-0026581 | 3/2016 |
| WO | WO 2015/194083 | 12/2015 |
| WO | WO 2015/166345 | 1/2016 |

OTHER PUBLICATIONS

Yue Li et al., "A Quadband Antenna with Reconfigurable Feedings", IEEE Antennas and Wireless Propagation Letters, vol. 8, Sep. 1, 2009, 3 pages.
European Search Report dated Jun. 19, 2019 issued in counterpart application No. 17846846.8-1205, 14 pages.
Indian Examination Report dated Jul. 28, 2020 issued in counterpart application No. 201927012078, 4 pages.

* cited by examiner

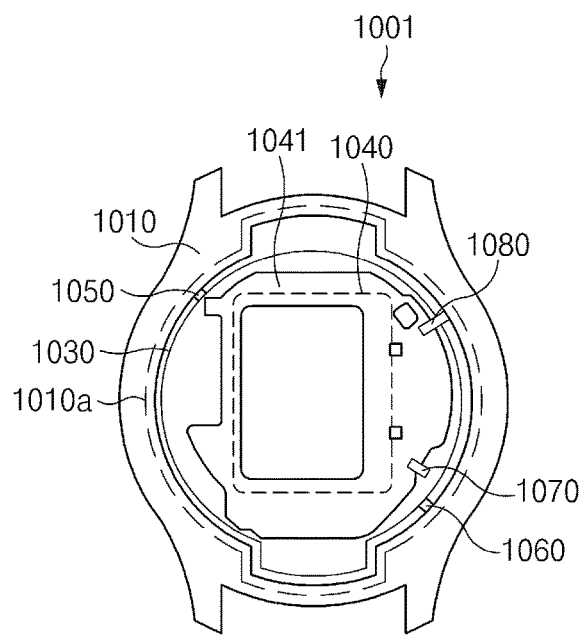
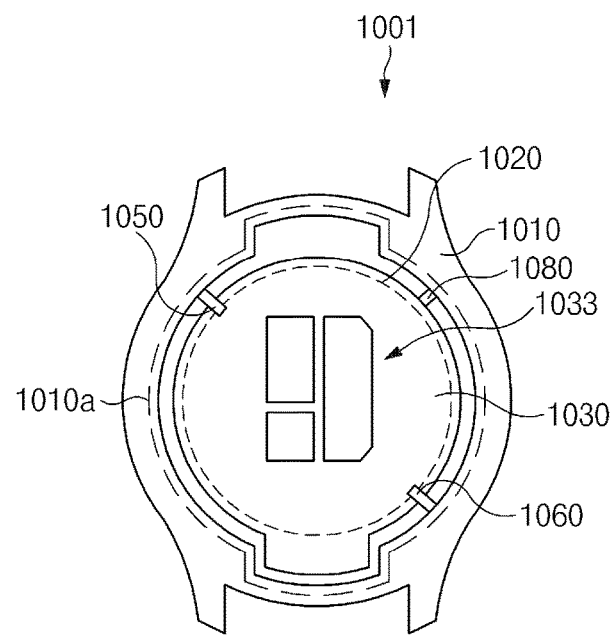
FIG. 10B
FIG. 10C

WEARABLE DEVICE INCLUDING MUTLI-BAND ANTENNA

PRIORITY

This application claims priority under 35 U.S.C. § 119(a) to a Korean Patent Application filed on Aug. 29, 2016 in the Korean Intellectual Property Office and assigned Serial No. 10-2016-0110319, the entire disclosure of which is incorporated herein by reference.

BACKGROUND

1. Field of the Disclosure

The present disclosure relates generally to a wearable electronic device including a multi-band antenna capable of transmitting and receiving signals of multiple bands.

2. Description of the Related Art

An electronic device such as a smartphone, a tablet personal computer (PC), or the like may communicate with a network by using an antenna. An antenna of an electronic device may receive signals in frequency bands (e.g., 900 MHz, 1.8 GHz, 2.1 GHz, and the like) in a 3rd generation (3G) network and may receive signals of various frequency bands for each nation and/or operator in a 3G-next network (e.g., long term evolution (LTE), LTE-advanced (LTE-A), and the like).

Currently, an electronic device may be manufactured to be small and lightweight such that the electronic device may be mounted on a part of a person's body, for example, a wrist. In addition, components for performing various functions and an antenna for receiving a wireless signal may be installed in a confined space of a wearable device.

If a plurality of antennas are mounted in an interior of an electronic device to receive signals of various bands, the electronic device may become thick and difficult to miniaturize.

It is difficult to mount various types of antennas for transmitting/receiving signals of many bands in a confined space of a wearable device. If various types of antennas are mounted in a wearable device, a sufficient spacing distance between any metal component(s) and the antennas may be unattainable, thereby reducing the performance of the antennas.

SUMMARY

An aspect of the present disclosure is to provide a wearable electronic device capable of using conductive components of the wearable electronic device as a radiator for transmitting/receiving signals of many bands.

In accordance with an aspect of the present disclosure, a wearable device is provided. The wearable device includes an outer housing including a first surface facing a first direction, a second surface facing a second direction opposite to the first direction, and a side surface surrounding a space between the first surface and the second surface, wherein a metal frame is formed on at least a portion of the side surface, a display wherein at least a portion of which is exposed through the first surface of the outer housing, a printed circuit board (PCB) interposed between the second surface and the display in an interior of the outer housing, a communication circuit disposed on the PCB, and a ground area provided in the PCB, wherein the metal frame is electrically connected to the communication circuit at a first point of the metal frame and is selectively connected to the ground area at a second point of the metal frame, and wherein the communication circuit is configured to transmit and/or receive a signal in a first frequency band by a first electrical path formed if the second point is not connected to the ground area, and transmit and/or receive a signal in a second frequency band by a second electrical path formed if the second point is connected to the ground area.

In accordance with another aspect of the present disclosure, a wearable device is provided. The wearable device includes an outer housing including a first surface facing a first direction, a second surface facing a second direction opposite to the first direction, and a side surface surrounding a space between the first surface and the second surface, wherein a metal frame is formed on at least a portion of the side surface, a display wherein at least a portion of which is exposed through the first surface of the outer housing, a PCB interposed between the second surface and the display in an interior of the outer housing, a communication circuit disposed on the PCB, and a ground area provided in the PCB, wherein the metal frame is electrically connected to the communication circuit at a first point and a second point of the metal frame, wherein the metal frame is electrically connected to the ground area at a third point having a different electrical length with respect to the first point and the second point, and wherein the communication circuit is configured to transmit and/or receive a signal in a first frequency band by a first electrical path formed between the first point and the third point, and transmit and/or receive a signal in a second frequency band by a second electrical path formed between the second point and the third point.

In accordance with another aspect of the present disclosure, wearable device is provided. The wearable device includes an outer housing including a first surface facing a first direction, a second surface facing a second direction opposite to the first direction, and a side surface surrounding a space between the first surface and the second surface, wherein a metal frame is formed on at least a portion of the side surface, a display wherein at least a portion of which is exposed through the first surface of the outer housing, a PCB interposed between the second surface and the display in an interior of the outer housing, a communication circuit disposed on the PCB, a ground area provided in the PCB, and a switching circuit connected between the communication circuit, the ground area, and the metal frame at a first point, a second point, and a third point of the metal frame, wherein the third point has a different electrical length with respect to the first point and the second point, and wherein the communication circuit is configured to transmit and/or receive a signal in a multiple frequency band at the first point, the second point, and the third point based on an electrical connection to the communication circuit and the ground area.

BRIEF DESCRIPTION OF THE DRAWINGS

The above and other aspects, features, and advantages of the present disclosure will be more apparent from the following description, taken in conjunction with the accompanying drawings, in which:

FIGS. 10A, 10B, 10C, 10D, and 10E are sectional views and illustrations of an electronic device that uses a battery structure as a ground, according to an embodiment of the present disclosure;

DETAILED DESCRIPTION OF EMBODIMENTS OF THE PRESENT DISCLOSURE

Figure 1:
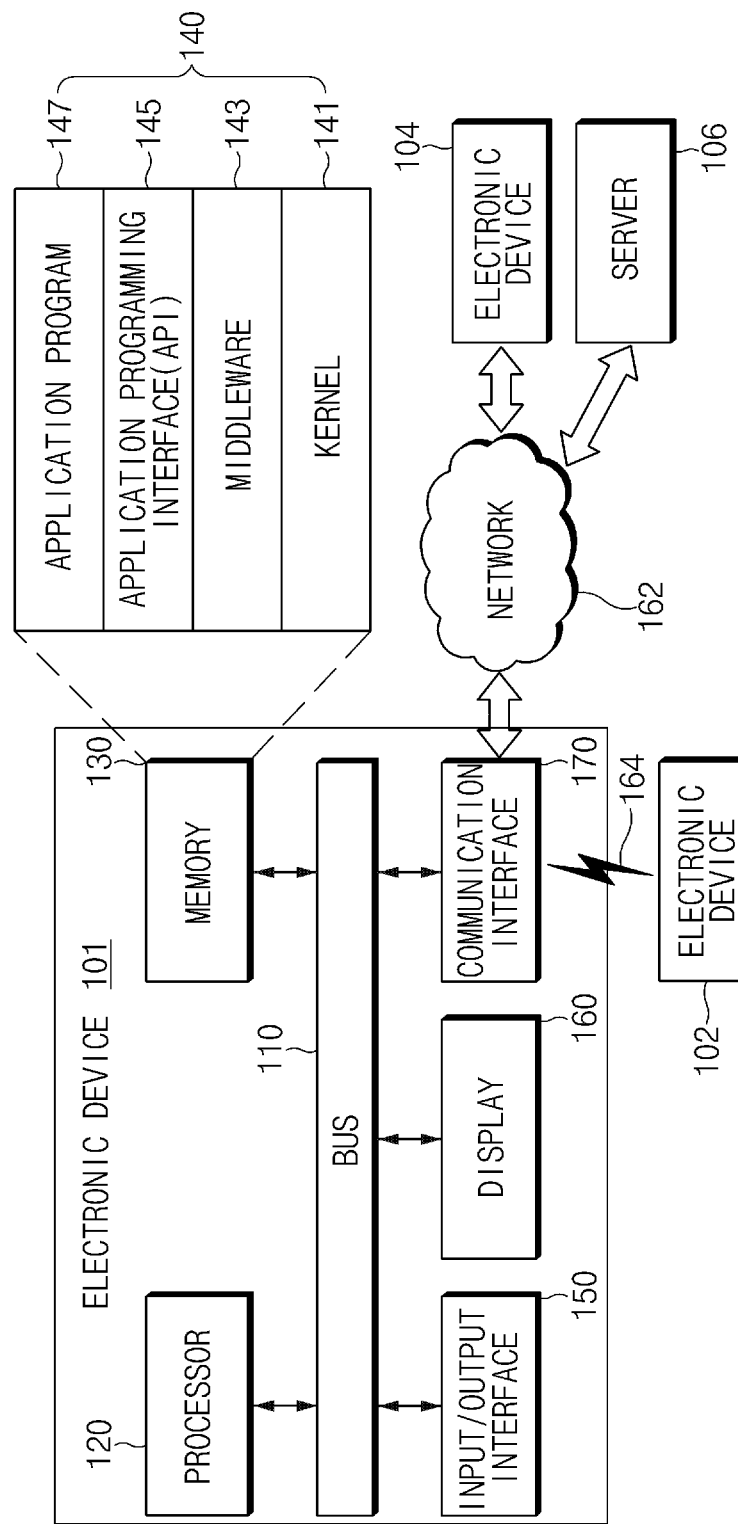
FIG. 1 is a block diagram of an electronic device in a network environment, according to an embodiment of the present disclosure.

Hereinafter, various embodiments of the present disclosure are described with reference to the accompanying drawings. Accordingly, those of ordinary skill in the art will recognize that a modification, an equivalent, and/or an alternative of the the present disclosure may be variously made without departing from the scope and spirit of the present disclosure. With regard to description of the accompanying drawings, similar elements may be marked by similar reference numerals.

In the present disclosure, the expressions "have", "may have", "include", "comprise", "may include" and "may comprise" indicate an existence of corresponding features (e.g., elements such as numeric values, functions, operations, or components) but are not intended to exclude the presence of additional features.

In the present disclosure, the expressions "A or B", "at least one of A and/or B", and "one or more of A and/or B", and the like may include any and all combinations of one or more of the associated listed items. For example, the expressions "A or B", "at least one of A and B", and "at least one of A or B" refer to all of (1) at least one A, (2) at least one B, and (3) both of at least one A and at least one B.

The terms, such as "first", "second", and the like used in the present disclosure may be used to refer to various elements regardless of the order and/or the priority and to distinguish the relevant elements from other elements, but are not intended to limit the elements. For example, "a first user device" and "a second user device" indicate different user devices regardless of the order or priority. For example, without departing from the scope of the present disclosure, a first element may be referred to as a second element, and similarly, a second element may be referred to as a first element.

It will be understood that if an element (e.g., a first element) is referred to as being "(operatively or communicatively) coupled with/to" or "connected to" another element (e.g., a second element), the element may be directly coupled with/to or connected to the other element or an intervening element (e.g., a third element) may be present. In contrast, if an element (e.g., a first element) is referred to as being "directly coupled with/to" or "directly connected to" another element (e.g., a second element), it should be understood that there is no intervening element (e.g., a third element).

According to the situation, the expression "configured to" used in the present disclosure may be used as, for example, the expressions "suitable for", "having the capacity to", "designed to", "adapted to", "made to", or "capable of". The term "configured to" may not indicate only "specifically designed to" in hardware. Instead, the expression "a device configured to" may indicate that the device is "capable of" operating together with another device or other components. For example, the expression "processor configured to (or set to) perform A, B, and C" may indicate a dedicated processor (e.g., an embedded processor) for performing a corresponding operation or a general purpose processor (e.g., a central processing unit (CPU) or an application processor (AP)) which performs corresponding operations by executing one or more software programs which are stored in a memory device.

Terms used in the present disclosure are used to describe certain embodiments but are not intended to limit the scope of the present disclosure. The terms of a singular form may include plural forms unless otherwise specified. All of the terms used herein, may have the same meanings that are generally understood by a person skilled in the art. It will be further understood that terms, which are defined in a dictionary and commonly used, should also be interpreted as is customary in the relevant related art but not in an idealized or overly formal manner unless expressly so defined in various embodiments of the present disclosure. In some cases, even if terms are defined in the present disclosure, they are not intended to be interpreted to exclude embodiments of the present disclosure.

An electronic device according to various embodiments of the present disclosure may include at least one of, for example, smartphones, tablet PCs, mobile phones, video telephones, electronic book readers, desktop PCs, laptop PCs, netbook computers, workstations, servers, personal digital assistants (PDAs), portable multimedia players (PMPs), moving picture experts group (MPEG-1 or MPEG-2) audio layer 3 (MP3) players, mobile medical devices, cameras, or wearable devices. According to various embodiments of the present disclosure, a wearable device may include at least one of an accessory type (e.g., watches, rings, bracelets, anklets, necklaces, glasses, contact lenses, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments of the present disclosure, an electronic device may be a home appliance. Home appliances may include at least one of, for example, televisions (TVs), digital versatile disc (DVD) players, audio players, refrigerators, air conditioners, cleaners, ovens, microwave ovens, washing machines, air cleaners, set-top boxes, home automation control panels, security control panels, TV boxes (e.g., Samsung HomeSync®, Apple TV®, or Google TV™), game consoles (e.g., Xbox® or PlayStation®), electronic dictionaries, electronic keys, camcorders, electronic picture frames, and the like.

According to an embodiment of the present disclosure, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA) device, a magnetic resonance imaging (MRI) device, a computed tomography (CT) device, scanners, and ultrasonic devices), navigation devices, global navigation satellite system (GNSS) devices, event data recorders (EDRs), flight data recorders (FDRs), vehicle infotainment devices, electronic equipment for vessels (e.g., navigation systems and gyrocompasses), avionics devices, security devices, head units for vehicles, industrial or home robots, automated teller machines (ATMs), points of sales (POSs) devices, or Internet of Things devices (e.g., light bulbs, various sensors, electric or gas meters, sprinkler devices, fire alarms, thermostats, street lamps, toasters, exercise equipment, hot water tanks, heaters, boilers, and the like).

According to an embodiment of the present disclosure, an electronic device may include at least one of parts of furniture or buildings/structures, electronic boards, electronic signature receiving devices, projectors, or various measuring instruments (e.g., water meters, electricity meters, gas meters, or wave meters, and the like). An electronic device may be one of the above-described devices or a combination thereof. An electronic device may be a flexible electronic device. Furthermore, an electronic device is not intended to be limited to the above-described electronic devices but may include other electronic devices and electronic devices to be developed.

Hereinafter, electronic devices according to embodiments of the present disclosure are described with reference to the accompanying drawings. In the present disclosure, the term "user" may refer to a person who uses an electronic device or may refer to a device (e.g., an artificial intelligence electronic device) that uses an electronic device.

FIG. 1 is a block diagram of an electronic device 101 in a network environment system, according to an embodiment of the present disclosure.

Referring to FIG. 1, the electronic device 101, a first electronic device 102, a second electronic device 104, or a server 106 may be connected to each other over a network 162 or a short range communication 164. The electronic device 101 may include a bus 110, a processor 120, a memory 130, an input/output interface 150, a display 160, and a communication interface 170. The electronic device 101 may omit at least one of the above-described elements or may further include other element(s).

For example, the bus 110 may interconnect the above-described elements 110 to 170 and may include a circuit for conveying communications (e.g., a control message and/or data) among the above-described elements 110 to 170.

The processor 120 may include one or more of a CPU, an AP, or a communication processor (CP). For example, the processor 120 may perform an arithmetic operation or process data associated with control and/or communication of at least other elements of the electronic device 101.

The memory 130 may include a volatile and/or a non-volatile memory. For example, the memory 130 may store instructions or data associated with at least one other element(s) of the electronic device 101. According to an embodiment of the present disclosure, the memory 130 may store software and/or a program 140. The program 140 may include, for example, a kernel 141, middleware 143, an application programming interface (API) 145, and/or an application program (or application) 147. At least a part of the kernel 141, the middleware 143, or the API 145 may be referred to as an operating system (OS).

For example, the kernel 141 may control or manage system resources (e.g., the bus 110, the processor 120, the memory 130, and the like) that are used to execute operations or functions of other programs (e.g., the middleware 143, the API 145, and the application 147). Furthermore, the kernel 141 may provide an interface that allows the middleware 143, the API 145, or the application 147 to access discrete elements of the electronic device 101 so as to control or manage system resources.

The middleware 143 may perform, for example, a mediation role such that the API 145 or the application 147 communicates with the kernel 141 to exchange data.

Furthermore, the middleware 143 may process task requests received from the application 147 according to a priority. For example, the middleware 143 may assign a priority, which makes it possible to use a system resource (e.g., the bus 110, the processor 120, the memory 130, or the like) of the electronic device 101, to at least one of the applications 147. For example, the middleware 143 may process the one or more task requests according to the priority assigned to the at least one or more task requests, which makes it possible to perform scheduling or load balancing on the one or more task requests.

The API 145 may be, for example, an interface through which the application 147 controls a function provided by the kernel 141 or the middleware 143, and may include, for example, at least one interface or function (e.g., an instruction) for a file control, a window control, image processing, a character control, or the like.

The input/output interface 150 may play a role, for example, an interface which transmits an instruction or data input from a user or another external device, to other element(s) of the electronic device 101. Furthermore, the input/output interface 150 may output an instruction or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, a gesture, a proximity input, or a hovering input using an electronic pen or a part of a user's body.

For example, the communication interface 170 may establish communication between the electronic device 101 and the first electronic device 102, the second electronic device 104, or the server 106. For example, the communication interface 170 may be connected to the network 162 over wireless communication or wired communication to communicate with the second electronic device 104 or the server 106.

The wireless communication may use at least one of, for example, LTE, LTE-A, code division multiple access (CDMA), wideband CDMA (WCDMA), universal mobile telecommunications system (UMTS), wireless broadband (WiBro), global system for mobile communications (GSM), or the like, as cellular communication protocol. Furthermore, the wireless communication may include, for example, the short range communication 164. The short range communication 164 may include at least one of wireless fidelity (Wi-Fi), Bluetooth, near field communication (NFC), magnetic stripe transmission (MST), a global navigation satellite system (GNSS), or the like.

MST may generate a pulse in response to a transmission of data using an electromagnetic signal, and the pulse may generate a magnetic field signal. The electronic device 101 may transfer the magnetic field signal to the POS device, and the POS device may detect the magnetic field signal using an MST reader. The POS device may recover data by converting a detected magnetic field signal to an electrical signal.

GNSS may include at least one of, for example, a global positioning system (GPS), a global navigation satellite system (Glonass), a Beidou navigation satellite system (Beidou), or a European global satellite-based navigation system (Galileo) based on an available region, a bandwidth, or the like. Hereinafter, "GPS" and "GNSS" may be interchangeably used. A wired communication may include at least one of, for example, a universal serial bus (USB), a high definition multimedia interface (HDMI), a recommended standard-232 (RS-232), a plain old telephone service (POTS), or the like. The network 162 may include at least one of telecommunications networks, for example, a computer network (e.g., a local area network (LAN) or a wide area network (WAN)), an Internet, or a telephone network.

Each of the first and second electronic devices 102 and 104 may be a device of a type that is different from or the same as that of the electronic device 101. According to an embodiment of the present disclosure, the server 106 may include a group of one or more servers. All or a portion of operations that the electronic device 101 may be requested to perform may be executed by another or plural electronic devices (e.g., the first electronic device 102, the second electronic device 104 or the server 106). In a case where the electronic device 101 executes any function or service automatically or in response to a request, the electronic device 101 might not perform the function or the service internally, but, may alternatively or additionally, request that at least a portion of a function associated with the electronic device 101 be performed at the first electronic device 102, the second electronic device 104, or the server 106. The other electronic device may execute the requested function or the additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figures 2A, 2B:
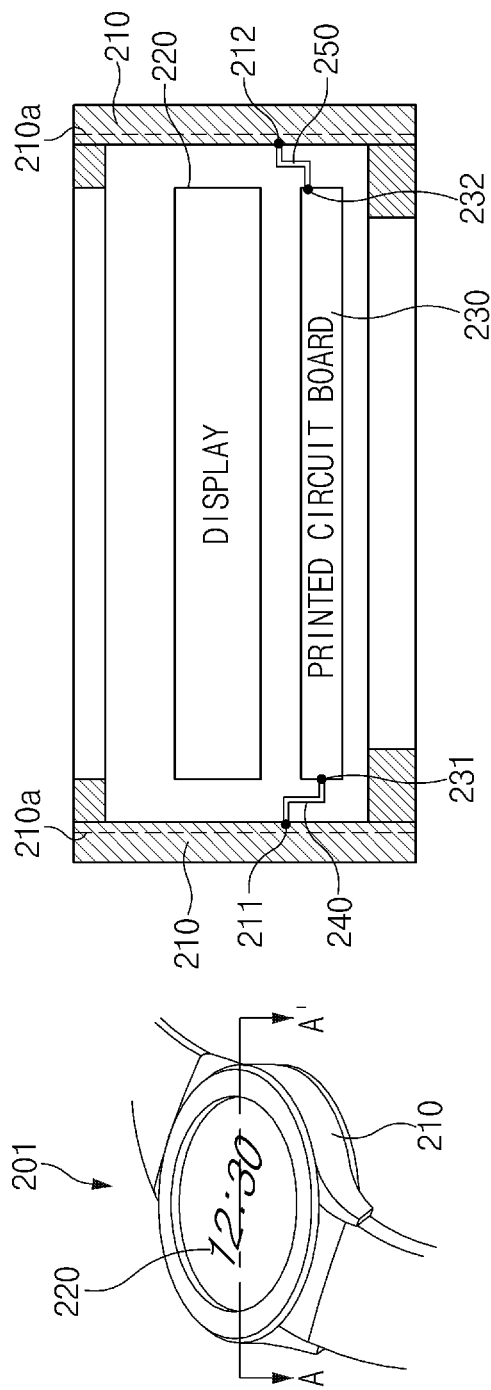
FIGS. 2A and 2B are a perspective view and a sectional view of an electronic device, according to an embodiment of the present disclosure.

FIGS. 2A and 2B are a perspective view and a sectional view of an electronic device 201, according to an embodiment of the present disclosure.

Referring to FIGS. 2A and 2B, the wearable electronic device 201 may include an outer housing 210, a display 220, a PCB 230, a feeding line 240, and a ground line 250. FIG. 2B is a cross-section of FIG. 2A taken along line A-A in FIG. 2A.

According to an embodiment of the present disclosure, the outer housing 210 may include a first surface (a front surface) facing a first direction, a second surface (a rear surface) facing a second direction, and a side surface. The first direction and the second direction may be opposite to each other. For example, a through hole of a certain size may be disposed on a center of the front surface to form an opening. The through hole may have a size that is large enough to expose the display 220. For example, the rear surface may fix and protect internal elements. For example, the rear surface may be coupled to a body of the electronic device 201 after being manufactured as a separate component. The side surface may be defined to surround a space between the first surface and the second surface.

According to an embodiment of the present disclosure, the display 220, the PCB 230, and various elements (e.g., a battery and the like) may be disposed in the interior of the electronic device 201 defined by the front surface, the rear surface, and the side surface of the outer housing 210.

According to an embodiment of the present disclosure, at least a portion of the side surface of the outer housing 210 may be implemented with a metal frame 210a that is formed of a conductive material (e.g., a metal). For example, the metal frame 210a may have a closed loop shape in which the side surface is not partitioned. The metal frame 210a may be formed on the front surface and the side surface of the outer housing 210. The metal frame 210a may be formed in the vicinity of the through hole, for example. A characteristic of a resonant frequency may vary according to a location at which the metal frame 210a is formed.

According to an embodiment of the present disclosure, the metal frame 210a may be used as a radiator of an antenna for transmitting/receiving data to/from an external device. For example, the metal frame 210a may be used as an antenna radiator of a mobile communication module for 3G, 4G, and the like. For another example, the metal frame 210a may be used as an antenna radiator of a GPS communication module, an NFC communication module, a Bluetooth communication module, and the like. A characteristic of the corresponding resonant frequency may vary according to a location at which the metal frame 210a is formed.

According to an embodiment of the present disclosure, at least a portion of the display 220 may be exposed to the outside through the through hole of the outer housing 210. For example, glass may be attached to the through hole. The display 220 may include an area exposed through the through hole and an area seated inside the outer housing 210. The display 220 may include a display panel (e.g., an LCD display or an OLED display), a panel (e.g., a touch panel) for receiving an input of a user, and the like. For example, the display 220 may be implemented with a one cell touch active-matrix OLED (AMOLED) (OCTA) display in which a touch panel and an AMOLED display are integrated. The display 220 may output an image, a text, and the like through the panel.

The PCB 230 may include modules or integrated circuits (ICs) needed to drive the electronic device 201. According to an embodiment of the present disclosure, the PCB 230 may include a communication circuit, a control circuit, and the like. The communication circuit may be electrically connected to the metal frame 210a used as an antenna radiator to transmit/receive a wireless signal. The control circuit may be connected to the communication circuit to control transmitting/receiving signals.

According to an embodiment of the present disclosure, the PCB 230 may include a feeding part 231 and a ground area 232. The feeding part 231 may be connected to the communication circuit and may be electrically connected to a first point 211 of the metal frame 210a through the feeding line 240. The ground area 232 may be electrically connected to a second point 212 of the metal frame 210a through the ground line 250. As such, as a radiator of an antenna, the metal frame 210a may transmit/receive a signal in a frequency band that corresponds to an electrical path formed between the first point 211 and the second point 212. For example, the electronic device 201 may transmit/receive a frequency of a target band by controlling the first point 211 connected to the feeding part 231 or the second point 212 connected to the ground area 232. The electronic device 201 may also transmit/receive signals in multiple frequency bands by controlling a connection between the first point 212 and the second point 212. The electronic device 201 may be electrically connected to the feeding part 231 or the ground area 232 at many points of the metal frame 210a and may transmit/receive signals in multiple frequency bands by controlling a connection to the feeding part 231 or the ground area 232. The electronic device 201 may transmit/receive signals in multiple frequency bands by connecting an element (e.g., an inductor, a capacitor, or the like) to the ground area 232.

Below, a connection between the metal frame 210a and the PCB 230 of an electronic device according to various embodiments of the present disclosure is described in greater detail.

Figure 3A:
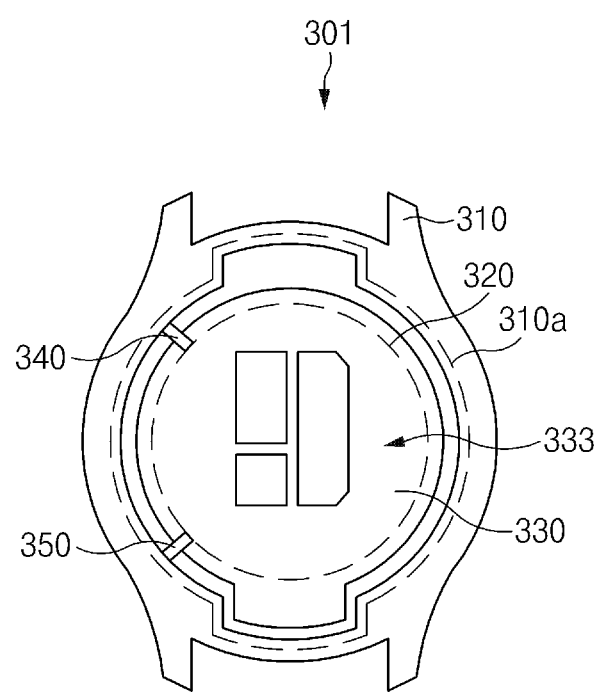
FIGS. 3A and 3B are illustrations of an electronic device connected to one ground area, according to an embodiment of the present disclosure.
Figure 3B:
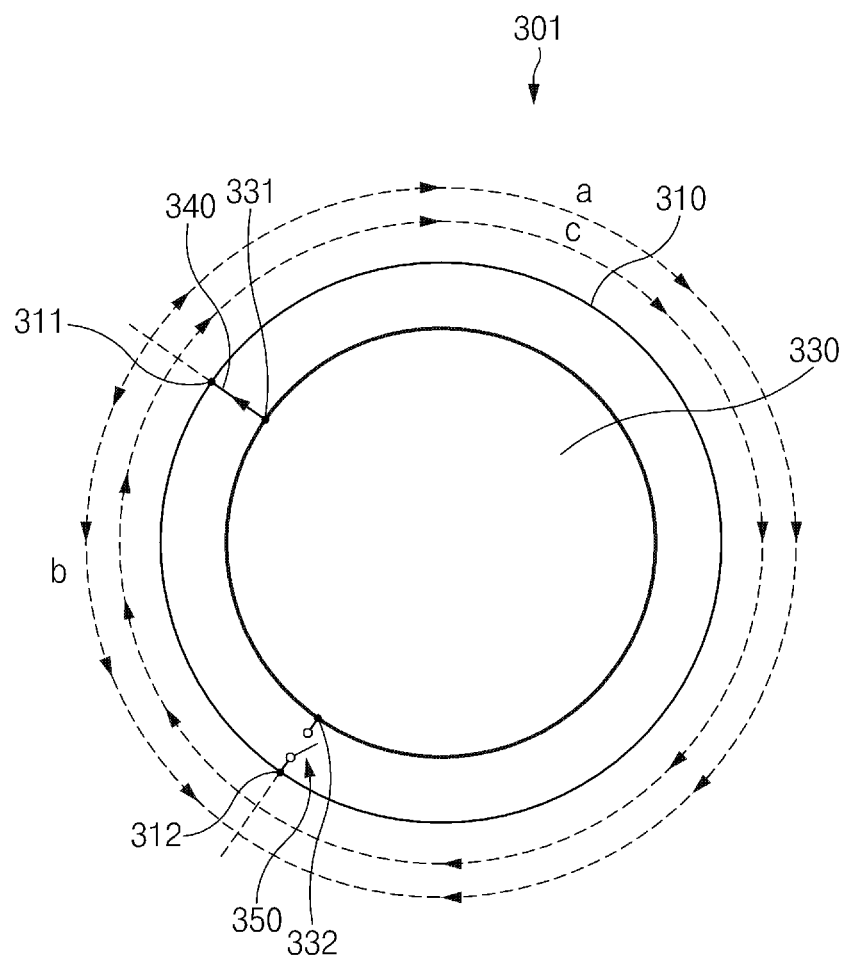

FIGS. 3A and 3B are are illustrations of an electronic device 301 connected to one ground area, according to an embodiment of the present disclosure.

Referring to FIGS. 3A and 3B, the electronic device 301 in which a metal frame 310a of an outer housing 310 is connected to one ground area 332 is illustrated. According to an embodiment of the present disclosure, the electronic device 301 may include the outer housing 310, a display 320, a PCB 330, a feeding line 340, and a switch 350.

All or part of the outer housing 310 may be implemented with the metal frame 310a that is formed of a conductive material. The metal frame 310a may be used as an antenna radiator for transmitting/receiving data to/from an external device.

The display 320 may be interposed between the outer housing 310 and the PCB 330. For example, the display 320 may be exposed to the outside through a through hole of the outer housing 310.

The PCB 330 may include a feeding part 331, a ground area 332, and a chip 333. The feeding part 331 may be connected to a communication circuit and may be connected to a first point 311 of the metal frame 310a through the feeding line 340. The ground area 332 may be electrically connected to a second point 312 of the metal frame 310a through a switch 350. For example, the switch 350 may electrically connect the second point 312 of the metal frame 310a and the ground area 332 under control of a control circuit. The chip 333 may include a control circuit that controls electrical connection of the communication circuit and the metal frame 310a, which is capable of supplying power to the metal frame 310a.

Referring to FIG. 3B, the electronic device 301 may transmit/receive signals in multiple frequency bands by using at least a portion of the metal frame 310a of the outer housing 310.

According to an embodiment of the present disclosure, if the ground area 332 is connected to the second point 312 of the metal frame 310a by the switch 350 (e.g., if the switch 350 is short-circuited), the communication circuit may transmit/receive a signal in a frequency band that corresponds to an electrical path formed between the first point 311 and the second point 312. For example, a first electrical path "a" from the feeding part 331 to the ground area 332a through the first point 311 and the second point 312 may be formed. The communication circuit may transmit/receive a signal in a first frequency band corresponding to the first electrical path "a". For example, in a case where the communication circuit includes a carrier aggregation (CA) function, the communication circuit may transmit/receive a signal in a second frequency band through a second electrical path "b" that is formed in a direction opposite to the first electrical path "a".

According to an embodiment of the present disclosure, if the ground area 332 is not connected to the second point 312 of the metal frame 310a by the switch 350 (e.g., if the switch 350 is opened (or off)), the metal frame 310a may be only connected to the feeding part 331. For example, a third electrical path "c" through which power is supplied from the feeding part 331 to the first point 311 may be formed. The communication circuit may transmit/receive a signal in a third frequency band corresponding to the third electrical path "c".

The electronic device 301 may control the switch 350 to transmit/receive signals of the first frequency band, the second frequency band, and the third frequency band.

Figure 4A:
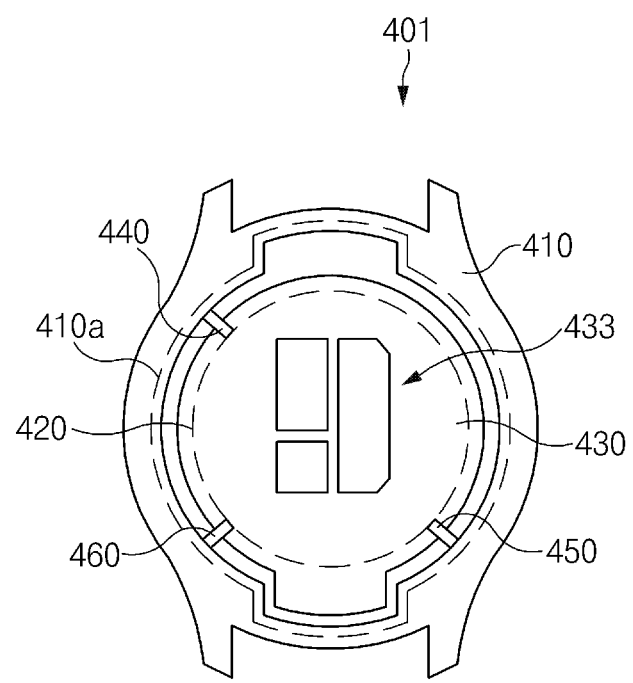
FIGS. 4A and 4B are illustrations of an electronic device connected to two ground areas, according to an embodiment of the present disclosure.
Figure 4B:
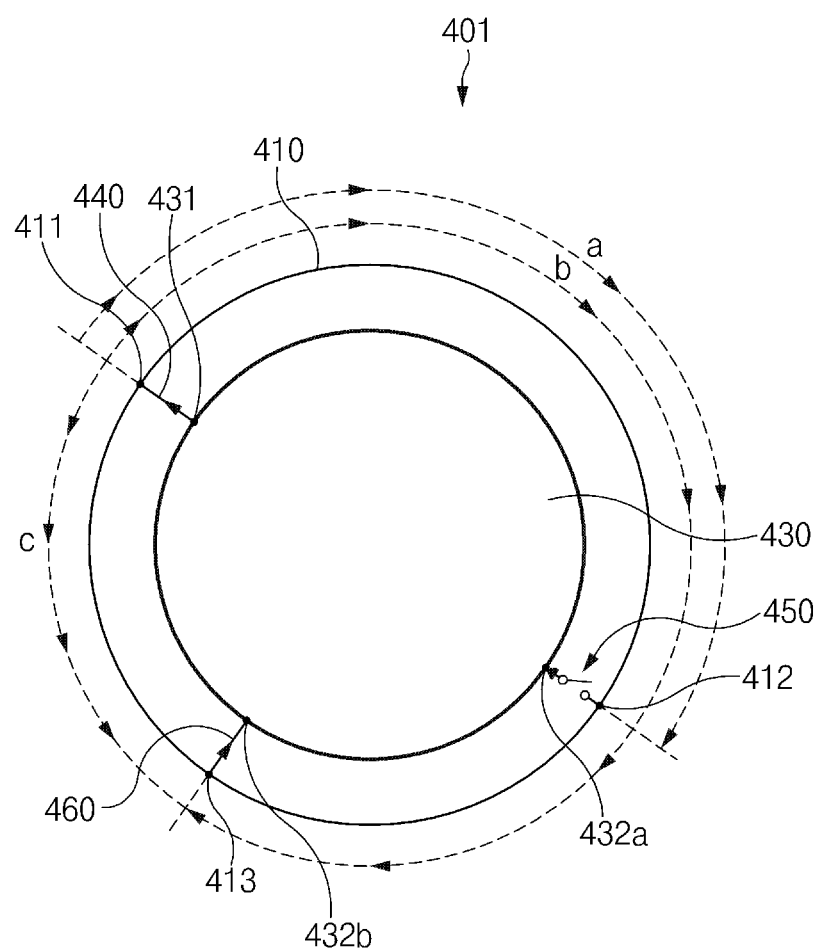

FIGS. 4A and 4B are illustrations of an electronic device 401 connected to two ground areas, according to an embodiment of the present disclosure.

Referring to FIGS. 4A and 4B, the electronic device 401 includes a metal frame 410a of an outer housing 410 connected to two ground areas 432a and 432b. According to an embodiment of the present disclosure, the electronic device 401 may include the outer housing 410, a display 420, a PCB 430, a feeding line 440, a switch 450, and a ground line 460.

With regard to FIGS. 4A and 4B, the descriptions of elements and operations that are duplicated with, correspond to, or are similar to the above-described contents are omitted. In other words, some elements and operations of the above-described contents may be applied to the embodiment of FIGS. 4A and 4B.

The PCB 430 may include a feeding part 431, the first ground area 432a, the second ground area 432b, and a chip 433. The feeding part 431 may be electrically connected to a first point 411 of the metal frame 410a through the feeding line 440. The first ground area 432a may be connected to a second point 412 of the metal frame 410a through the switch 450. The second ground area 432b may be electrically connected to a third point 413 of the metal frame 410a through the ground line 460. The chip 430 may include a control circuit that controls the communication circuit and the switch 450.

Referring to FIG. 4B, the electronic device 401 may transmit/receive signals in multiple frequency bands by using at least a portion of the metal frame 410a of the outer housing 410.

According to an embodiment of the present disclosure, if the first ground area 432a is connected to the second point 412 of the metal frame 410a by the switch 450 (e.g., if the switch 450 is short-circuited), the communication circuit may transmit/receive a signal in a frequency band that corresponds to an electrical path formed between the first point 411 and the second point 412. For example, a first electrical path "a" from the feeding part 431 to the first ground area 432a through the first point 411 and the second point 412 may be formed. The communication circuit may transmit/receive a signal in a first frequency band corresponding to the first electrical path "a".

According to an embodiment of the present disclosure, if the first ground area 432a is not connected to the second point 412 of the metal frame 410a by the switch 450 (e.g., if the switch 450 is opened (or off)), the communication circuit may transmit/receive a signal in a frequency band that corresponds to an electrical path formed between the first point 411 and the third point 413. For example, a second electrical path "b" from the feeding part 431 to the second ground area 432b through the first point 411 and the third point 413 may be formed. The communication circuit may transmit/receive a signal in a second frequency band corresponding to the second electrical path "b".

According to an embodiment of the present disclosure, in a case where the communication circuit includes a CA function, the communication circuit may transmit/receive a signal in a third frequency band through a third electrical path "c" formed between the first point 411 and the third point 413 in an opposite direction from the second electrical path "b" regardless of an operation of the switch 450.

The electronic device 401 may control the switch 450 to transmit/receive signals of the first frequency band, the second frequency band, and the third frequency band. For example, in the case where the electronic device 401 includes a plurality of chipsets for different communication manners, the electronic device 401 may use different types of mobile communication (e.g., 2G, 3G (e.g., GSM and CDMA), and 4G (e.g., LTE and LTE-A)) at a plurality of frequencies. For example, in a case where the communication circuit of the electronic device 401 includes one chipset, the electronic device 401 may use one type of mobile communication at a plurality of frequencies.

Figure 5A:
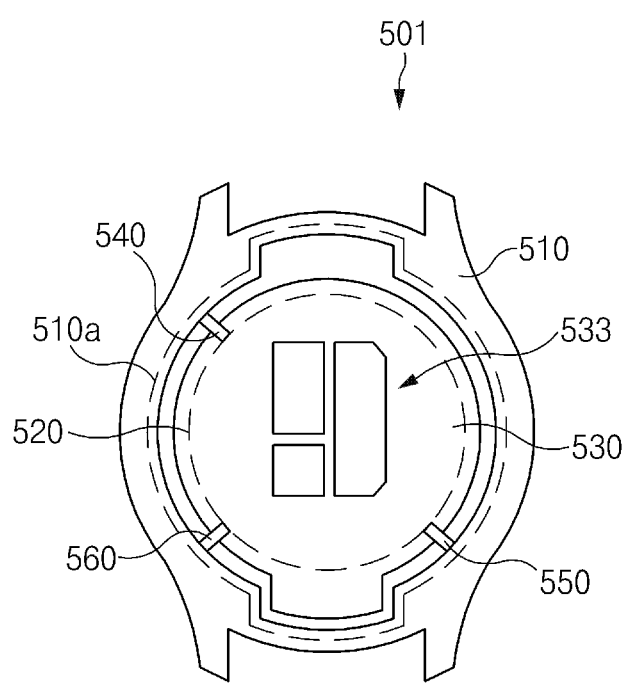
FIGS. 5A and 5B are illustrations of an electronic device connected to an impedance tuner, according to an embodiment of the present disclosure.
Figure 5B:
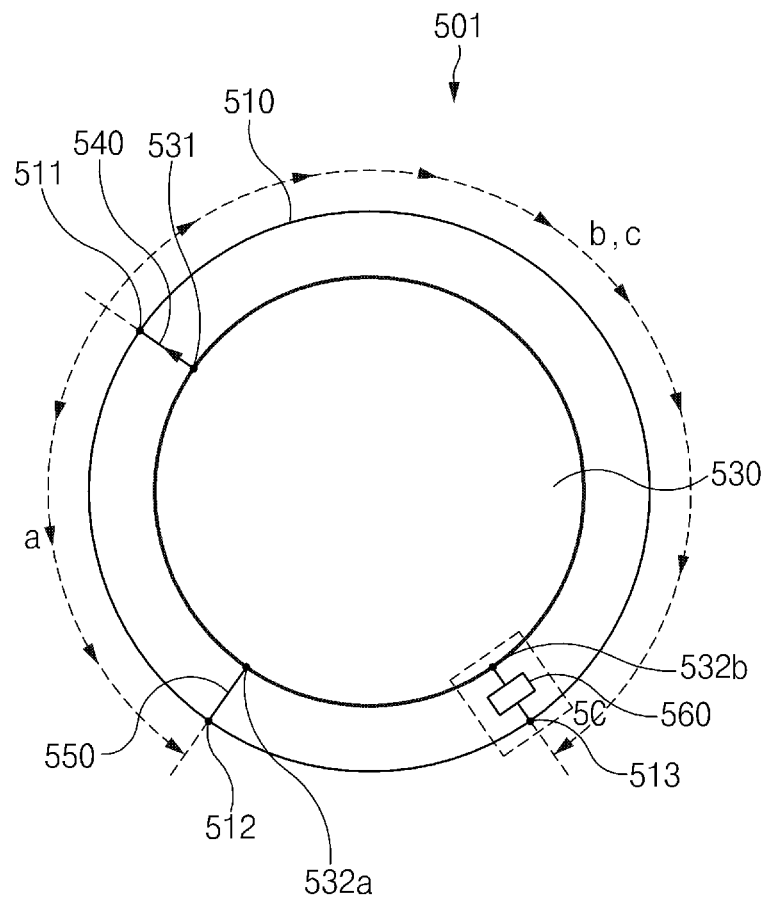

FIGS. 5A and 5B are illustrations of an electronic device 501 connected to an impedance tuner 560, according to an embodiment of the present disclosure.

Referring to FIGS. 5A and 5B, the electronic device 501 is connected to the impedance tuner 560. According to an embodiment of the present disclosure, the electronic device 501 may include an outer housing 510, a display 520, a PCB 530, a feeding line 540, an impedance tuner 550, and a ground line 560.

With regard to FIGS. 5A and 5B, the descriptions of elements and operations that are duplicated with, correspond to, or are similar to the above-described contents are omitted. In other words, some elements and operations of the above-described contents may be applied to the embodiment of FIGS. 5A and 5B.

The PCB 530 may include a feeding part 531, a first ground area 532a, a second ground area 532b, and a chip 533. The feeding part 531 may be electrically connected to a first point 511 of a metal frame 510a through the feeding line 540. The first ground area 532a may be electrically connected to a second point 512 of the metal frame 510a through the ground line 550. The second ground area 532b may be electrically connected to a third point 513 of the metal frame 510a through the impedance tuner 560.

Figure 5C:
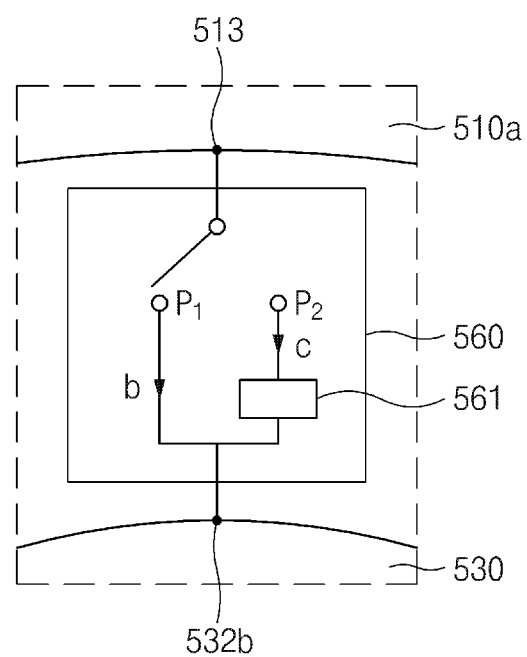
FIG. 5C is a partial view of the impedance tuner of the electronic device of FIG. 5B, according to an embodiment of the present disclosure.

FIG. 5C is a partial view of the impedance tuner 560 of the electronic device 501 of FIG. 5B, according to an embodiment of the present disclosure.

Referring to FIG. 5C, according to an embodiment of the present disclosure, the impedance tuner 560 may be a switching circuit that selects one of a first port P1 to form a path that does not include impedance 561 and a second port P2 to form a path that does include the impedance 561. For example, the impedance 561 may include at least one of an inductor and a capacitor. As such, the impedance tuner 560 may selectively connect a third point 513 of the metal frame 510a and the second ground area 532b via one of two paths.

The chip 533 may include a control circuit that controls the communication circuit and the impedance tuner 560.

Referring to FIGS. 5B and 5C, the electronic device 501 may transmit/receive signals in multiple frequency bands by using at least a portion of the metal frame 510a of the outer housing 510.

According to an embodiment of the present disclosure, if connected to the port P1 which forms a path that does not include the impedance 561 of the impedance tuner 560, the communication circuit may transmit/receive a signal in a frequency band that corresponds to an electrical path formed between the first point 511, the second point 512, and the third point 513. For example, a first electrical path "a" from the feeding part 531 to the ground area 532a through the first point 511 and the second point 512 may be formed. The communication circuit may transmit/receive a signal in a first frequency band corresponding to the first electrical path "a". For example, the second electrical path "b" from the feeding part 531 to the second ground area 532b through the first point 511 and the third point 513 may be formed. The communication circuit may transmit/receive a signal in a second frequency band corresponding to the second electrical path "b".

According to an embodiment of the present disclosure, if connected to the port P2 which form a path that includes the impedance 561 of the impedance tuner 560, the communication circuit may transmit/receive a signal in a frequency band that corresponds to an electrical path that includes the impedance 561. For example, a third electrical path "c" that is formed from the feeding part 531 to the second ground area 532b through the first point 511, the third point 513, and the impedance 561 may be formed. The communication circuit may transmit/receive a signal in a third frequency band corresponding to the third electrical path "c".

The electronic device 501 may control the impedance tuner 560 to transmit/receive a signal in any one of the second frequency band and the third frequency band as well as a signal in the first frequency band.

Figure 5D:
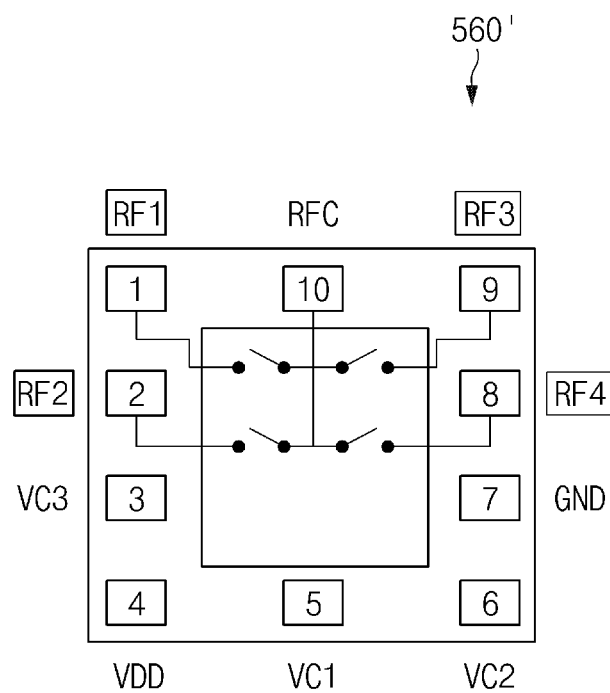
FIG. 5D is an illustration of an impedance tuner of an electronic device, according to an embodiment of the present disclosure.

FIG. 5D is an illustration of an impedance tuner 560' of an electronic device, according to an embodiment of the present disclosure.

Referring to FIG. 5D, the impedance tuner 560' may be connected to the electronic device 501. The impedance tuner 560' may be electrically connected between the third point 513 of the metal frame 510a and the second ground area 532b.

According to an embodiment of the present disclosure, the impedance tuner 560' may be a switching circuit that selects one of ports RF1, RF2, RF3, and RF4 connected to different impedances. The impedance tuner 560' may form different electrical paths by selecting the ports RF1, RF2, RF3, and RF4 connected to different impedances. The communication circuit may transmit/receive signals of the first to fourth frequency bands corresponding to the different electrical paths. The impedance tuner 560' may further include other ports VC1, VC2, VC3, and VDD for supplying power and a port GND to be connected to the second ground area 532b.

According to an embodiment of the present disclosure, the impedance tuner 560 or the impedance tuner 560' may be applied to the electronic device 301 of FIGS. 3A and 3B. For example, the impedance tuner 560 or the impedance tuner 560' may be connected between the second point 312 of the metal frame 310a and the ground area 332.

According to an embodiment of the present disclosure, the impedance tuner 560 or the impedance tuner 560' may be applied to the electronic device 401 of FIGS. 4A and 4B. For example, the impedance tuner 560 or the impedance tuner 560' may be connected between the second point 412 of the metal frame 410a and the first ground area 432a.

Figure 6A:
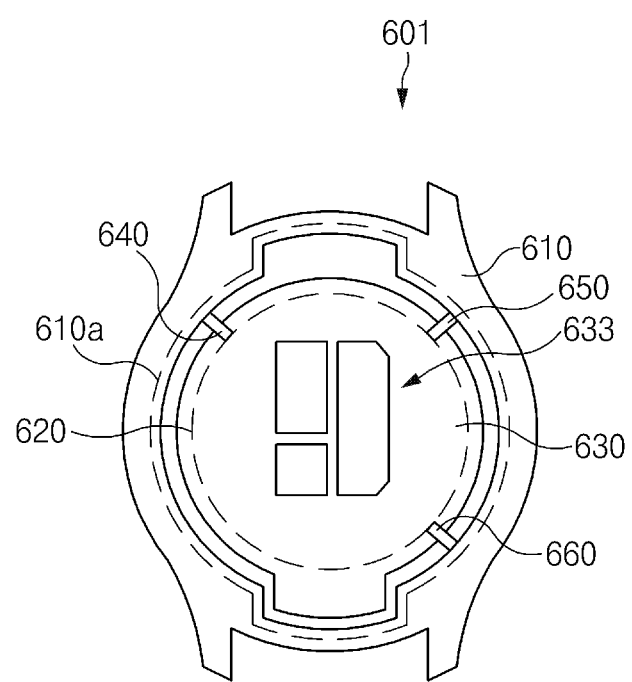
FIGS. 6A and 6B are illustrations of an electronic device connected to two feeding parts of a communication circuit, according to an embodiment of the present disclosure.
Figure 6B:
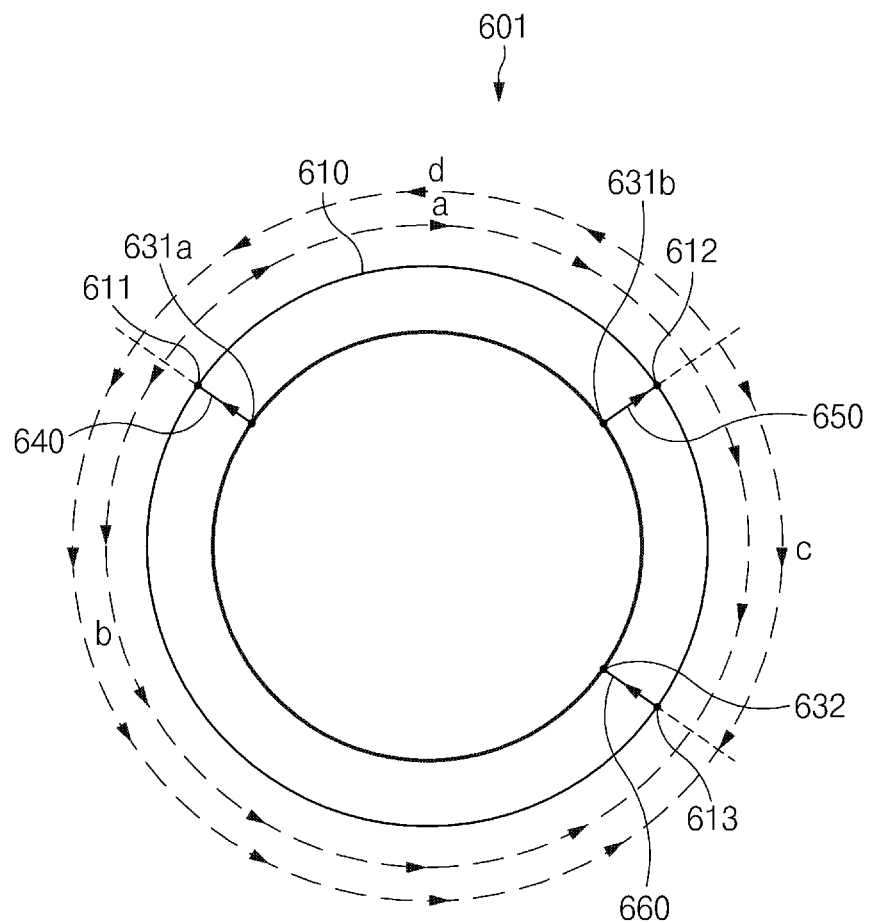

FIGS. 6A and 6B are illustrations of an electronic device 601 connected to two feeding parts of a communication circuit, according to an embodiment of the present disclosure.

Referring to FIGS. 6A and 6B, the electronic device 601 in which a metal frame 610a of an outer housing 610 is connected to two feeding parts 631a and 631b. According to an embodiment of the present disclosure, the electronic device 601 may include the outer housing 610, a display 620, a PCB 630, a first feeding line 640, a second feeding line 650, and a ground line 660.

With regard to FIGS. 6A and 6B, the descriptions of elements and operations that are duplicated with, correspond to, or are similar to the above-described contents are omitted. In other words, some elements and operations of the above-described contents may be applied to the embodiment of FIGS. 6A and 6B.

The PCB 630 may include a first feeding part 631a, a second feeding part 631b, a ground area 632, and a chip 633. The first feeding part 631a may be electrically connected to a communication circuit and may be electrically connected to a first point 611 of the metal frame 610a through the first feeding line 640. The second feeding part 631b may be electrically connected to the communication circuit and may be electrically connected to a second point 612 of the metal frame 610a through the second feeding line 650. The ground area 632 may be electrically connected to a third point 613 of the metal frame 610a through the ground line 660.

Referring to FIG. 6B, the electronic device 601 may transmit/receive signals in multiple frequency bands by using at least a portion of the metal frame 610a of the outer housing 610.

According to an embodiment of the present disclosure, the communication circuit may transmit/receive a signal in a frequency band that corresponds to an electrical path formed between the first point 611, the second point 612, and the third point 613. For example, a first electrical path "a" that is formed from the first feeding part 631a to the ground area 632 through the first point 611 and the third point 613 may be formed. The communication circuit may transmit/receive a signal in a first frequency band corresponding to the first electrical path "a". For example, in a case where the communication circuit includes a CA function, the communication circuit may transmit/receive a signal in a second frequency band through a second electrical path "b" formed between the first point 611 and the third point 613 in an opposite direction from the first electrical path "a". For example, a third electrical path "c" that is formed from the second feeding part 631b to the ground area 632 through the second point 612 and the third point 613 may be formed. The communication circuit may transmit/receive a signal in a third frequency band corresponding to the third electrical path "c". For example, the communication circuit may transmit/receive a signal in a fourth frequency band through a fourth electrical path "d" formed between the second point 612 and the third point 613 in an opposite direction from the third electrical path "c". The electronic device 601 may transmit/receive a signal belonging to any one of the first frequency band, the second frequency band, the third frequency band, and the fourth frequency band. For example, in a case where the electronic device 601 includes a plurality of chipsets for different communication manners, the electronic device 601 may use different types of mobile communication (e.g., 2G, 3G (e.g., GSM and CDMA), 4G (e.g., LTE and LTE-A)) at a plurality of frequencies. For example, in a case where the communication circuit of the electronic device 601 includes one chipset, the electronic device 601 may use one type of mobile communication at a plurality of frequencies.

Figure 7A:
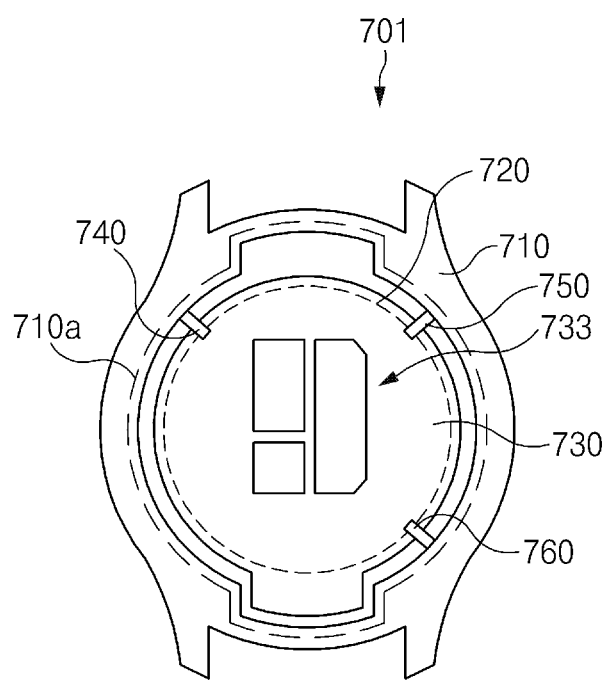
FIGS. 7A and 7B are illustrations of an electronic device in which switches are respectively connected to two feeding parts of a communication circuit, according to an embodiment of the present disclosure.
Figure 7B:
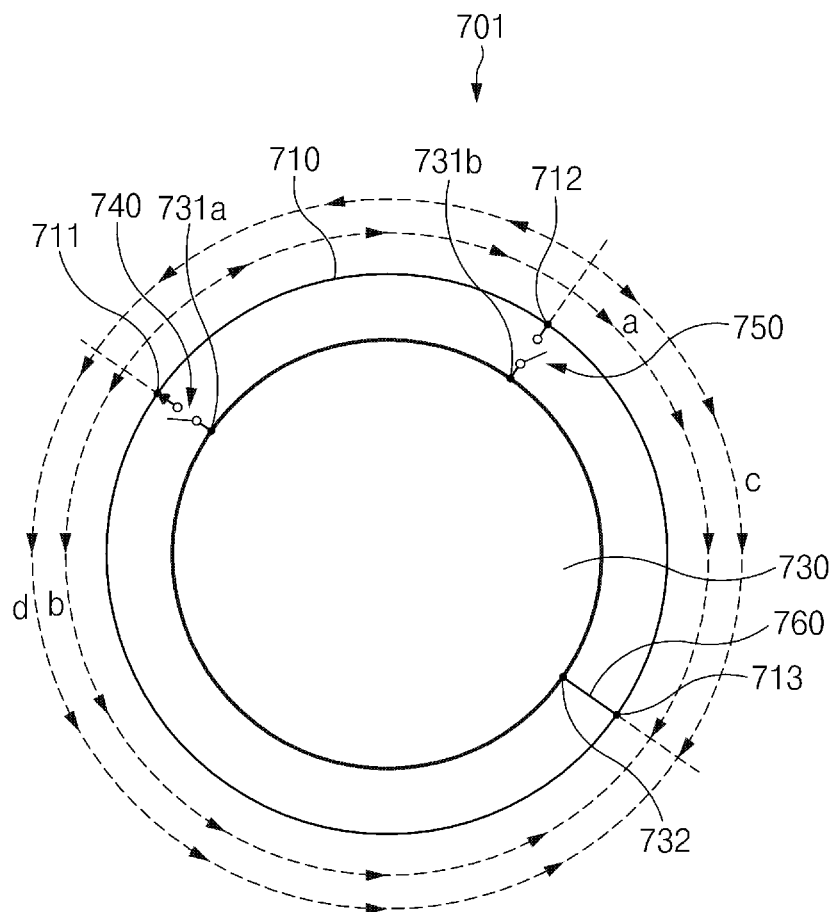

FIGS. 7A and 7B are are illustrations of an electronic device 701 in which switches are respectively connected to two feeding parts of a communication circuit, according to an embodiment of the present disclosure.

Referring to FIGS. 7A and 7B, the electronic device 701 includes two switches 740 and 750 that are connected to two feeding parts 731a and 731b. According to an embodiment, the electronic device 701 may include an outer housing 710, a display 720, a PCB 730, a first switch 740, a second switch 750, and a ground line 760.

With regard to FIGS. 7A and 7B, the descriptions of elements and operations that are duplicated with, correspond to, or are similar to the above-described contents are omitted. In other words, some elements and operations of the above-described contents may be applied to the embodiment of FIGS. 7A and 7B.

The PCB 730 may include a first feeding part 731a, a second feeding part 731b, a ground area 732, and a chip 733. The first feeding part 731a may be connected to a first point 711 of a metal frame 710a through the first switch 740. The second feeding part 731b may be connected to a second point 712 of the metal frame 710a through the second switch 750. The chip 733 may include a control circuit that controls the communication circuit and the switches 740 and 750.

Referring to FIG. 7B, the electronic device 701 may transmit/receive signals in multiple frequency bands by using at least a portion of the metal frame 710a of the outer housing 710.

According to an embodiment of the present disclosure, the first switch 740 and the second switch 750 may be complementary in operation. For example, the first feeding part 731a may be connected to the first point 711 of the metal frame 710a by the first switch 740 (e.g., the first switch 740 is short-circuited), and the second feeding part 731b may not be connected to the second point 712 of the metal frame 710a by the second switch 750 (e.g., the second switch 750 is opened). For example, the first feeding part 731a may not be connected to the first point 711 of the metal frame 710a by the first switch 740 (e.g., the first switch 740 is opened), and the second feeding part 731b may be connected to the second point 712 of the metal frame 710a by the second switch 750 (e.g., the second switch 750 is short-circuited).

As such, the metal frame 710a may be electrically connected to the PCB 730 at any one of the first point 711 and the second point 712.

According to an embodiment of the present disclosure, if the first switch 740 is short-circuited and the second switch 750 is opened, the communication circuit may transmit/receive a signal in a first frequency band that corresponds to an electrical path "a" formed between the first point 711 and a third point 713. In a case where the communication circuit includes a CA function, the communication circuit may transmit/receive a signal in a second frequency band through a second electrical path "b" formed between the first point 711 and the third point 713 in an opposite direction from the first electrical path "a".

According to an embodiment of the present disclosure, if the first switch 740 is opened and the second switch 750 is short-circuited, the communication circuit may transmit/receive a signal in a third frequency band that corresponds to an electrical path "c" formed between the second point 712 and the third point 713. In a case where the communication circuit includes a CA function, the communication circuit may transmit/receive a signal in a fourth frequency band through a fourth electrical path "d" formed between the second point 712 and the third point 713 in an opposite direction from the third electrical path "c".

The electronic device 701 may control the first switch 740 and the second switch 750 to transmit/receive a signal in any one of the first frequency band, the second frequency band, the third frequency band, and the fourth frequency band. Isolation of a multi-band antenna of the metal frame 710a may increase by selectively transmitting/receiving signals of the first frequency band and the second frequency band.

Figure 8A:
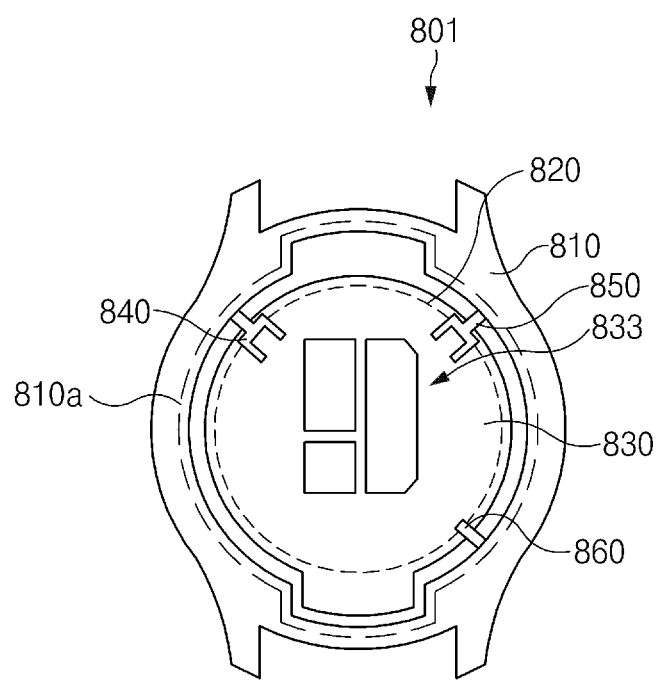
FIGS. 8A and 8B are illustrations of an electronic device in which a switching circuit is connected to two feeding parts of a communication circuit, according to an embodiment of the present disclosure.
Figure 8B:
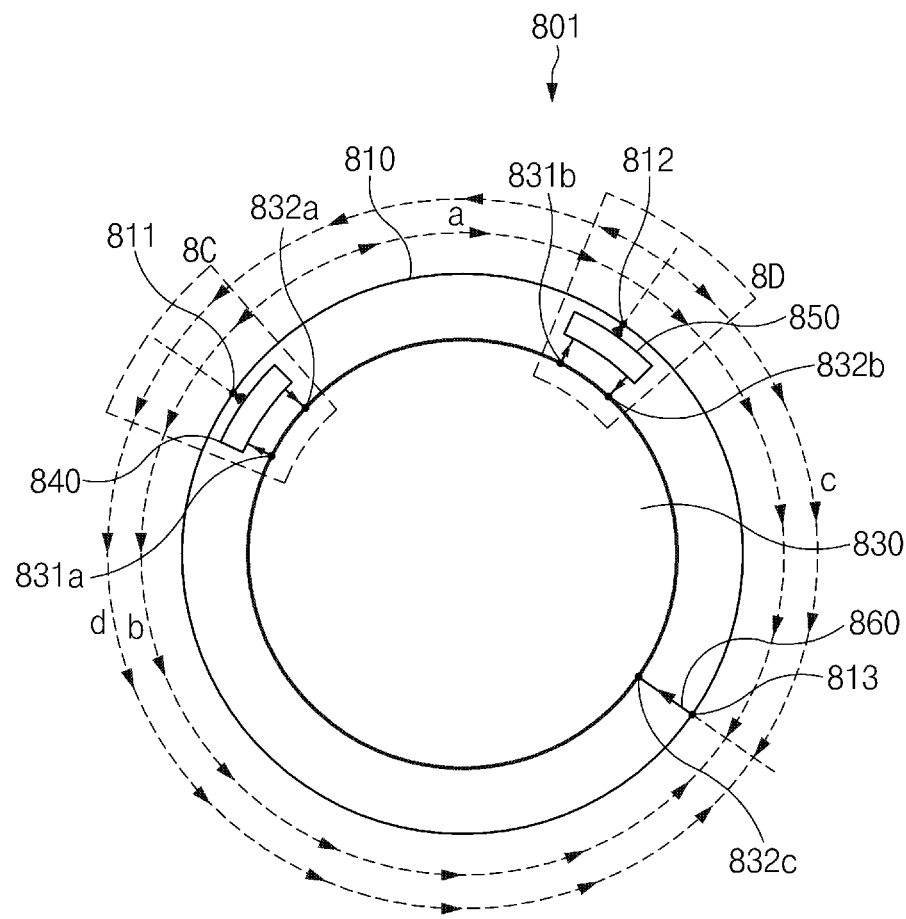

FIGS. 8A and 8B are illustrations of an electronic device 801 in which a switching circuit is connected to two feeding parts of a communication circuit, according to an embodiment of the present disclosure.

Referring to FIGS. 8A and 8B, the electronic device 801 includes two switching circuits 840 and 850 that are connected to two feeding parts 831a and 831b. According to an embodiment of the present disclosure, the electronic device 801 may include an outer housing 810, a display 820, a PCB 830, a first switching circuit 840, a second switching circuit 850, and a ground line 860.

With regard to FIGS. 8A and 8B, the descriptions of elements and operations that are duplicated with, correspond to, or are similar to the above-described contents are omitted. In other words, some elements and operations of the above-described contents may be applied to the embodiment of FIGS. 8A and 8B.

The PCB 830 may include a first feeding part 831a, a second feeding part 831b, a first ground area 832a, a second ground area 832b, a third ground area 832c, and a chip 833. The first feeding part 831a or the first ground area 832a may be electrically connected to a first point 811 of a metal frame 810a through the first switching circuit 840. The second feeding part 831b or the second ground area 832b may be electrically connected to a second point 812 of the metal frame 810a through the second switching circuit 850.

Figure 8C:
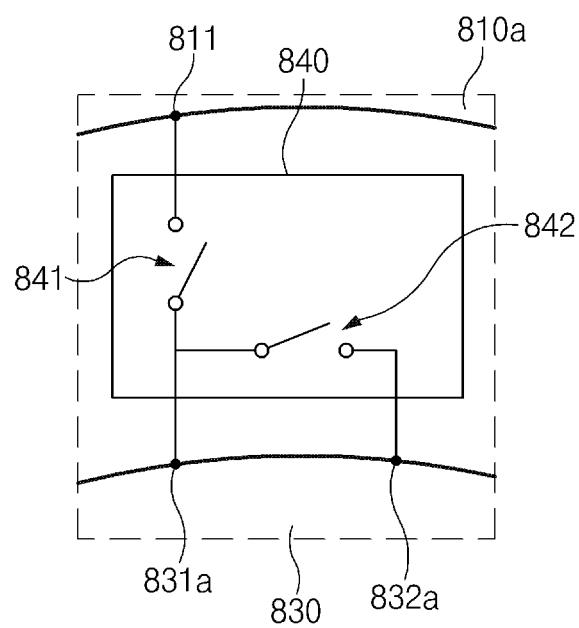
FIGS. 8C and 8D are partial views of switching circuits of the electronic device of FIG. 8B, according to an embodiment of the present disclosure.
Figure 8D:
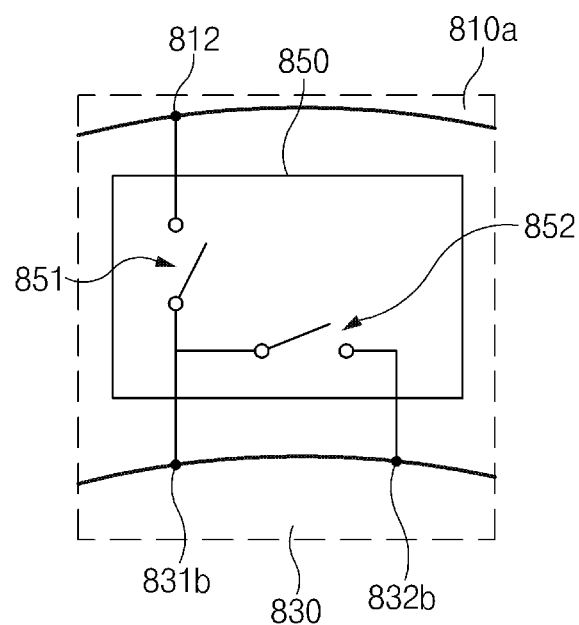

FIGS. 8C and 8D are partial views of switching circuits of the electronic device of FIG. 8B, according to an embodiment of the present disclosure.

Referring to FIG. 8C, the first switching circuit 840 may include a first switch 841 and a second switch 842. For example, the first switch 841 may be connected between the first point 811 and the first feeding part 831a. For example, the second switch 842 may be connected between the first feeding part 831a and the first ground area 832a.

Referring to FIG. 8D, the second switching circuit 850 may include a third switch 851 and a fourth switch 852. For example, the third switch 851 may be connected between the second point 812 and the second feeding part 831b. For example, the fourth switch 852 may be connected between the second feeding part 831b and the second ground area 832b.

As such, according to an embodiment of the present disclosure, the switching circuits 840 and 850 may connect the first point 811 and the second point 812 to the first feeding part 831a and the second feeding part 831b, respectively. If the feeding parts 831a and 831b are not connected to the metal frame 810a, the switching circuits 840 and 850 may connect the first feeding part 831a and the second feeding part 831b to the first ground area 832a and the second ground area 832b, respectively.

The third ground area 832c may be electrically connected to a third point 813 of the metal frame 810a through the ground line 860. The chip 833 may include a control circuit that controls the communication circuit and the switching circuits 840 and 850.

Referring to FIG. 8B, the electronic device 801 may transmit/receive signals in multiple frequency bands by using at least a portion of the metal frame 810a of the outer housing 810.

According to an embodiment of the present disclosure, the first switching circuit 840 and the second switching circuit 850 may be complementary in operation. For example, if the first switching circuit 840 connects the first point 811 of the metal frame 810a to the first feeding part 831a (e.g., if the first switch 841 is short-circuited and the second switch 842 is opened), the second switching circuit 850 may disconnect the second point 812 from the second feeding part 831b (e.g., the third switch 851 is opened). The second switching circuit 850 may connect the second feeding part 831b to the second ground area 832b (e.g., the fourth switch 852 is short-circuited). For example, if the second switching circuit 850 connects the second point 812 of the metal frame 810a to the second feeding part 831b (e.g., if the third switch 851 is short-circuited and the fourth switch 852 is opened), the first switching circuit 840 may disconnect the first point 811 from the first feeding part 831b (e.g., the first switch 841 is opened). The first switching circuit 840 may connect the first feeding part 831a to the first ground area 832a (e.g., the second switch 842 is short-circuited).

According to an embodiment of the present disclosure, the first feeding part 831a may be connected to the first point 811 of the metal frame 810a by the first switching circuit 840, and the second feeding part 831b may be connected to the second ground area 832b by the second switching circuit 850. The communication circuit may transmit/receive a signal in a first frequency band corresponding to a first electrical path "a" formed between the first point 811 and the third point 813. In a case where the communication circuit includes a CA function, the communication circuit may transmit/receive a signal in a second frequency band through a second electrical path "b" formed between the first point 811 and the third point 813 in an opposite direction from the first electrical path "a".

According to an embodiment of the present disclosure, the second feeding part 831b may be connected to the second point 812 of the metal frame 810a by the second switching circuit 850, and the first feeding part 831a may be connected to the first ground area 832a by the first switching circuit 840. The communication circuit may transmit/receive a signal in a third frequency band corresponding to a third electrical path "c" formed between the second point 812 and the third point 813. In a case where the communication circuit includes a CA function, the communication circuit may transmit/receive a signal in a fourth frequency band through a fourth electrical path "d" formed between the second point 812 and the third point 813 in an opposite direction from the third electrical path "c".

The electronic device 801 may control the first switching circuit 840 and the second switching circuit 850 to transmit/receive a signal in any one of the first frequency band, the second frequency band, the third frequency band, and the fourth frequency band. Compared to the electronic device 701 of FIGS. 7A and 7B, isolation of the electronic device 801 may increase by selectively transmitting/receiving signals of the first frequency band and the second frequency band and selectively connecting the feeding part 831a or 831b or the ground area 832a or 832b based on a selected frequency band.

Figure 9A:
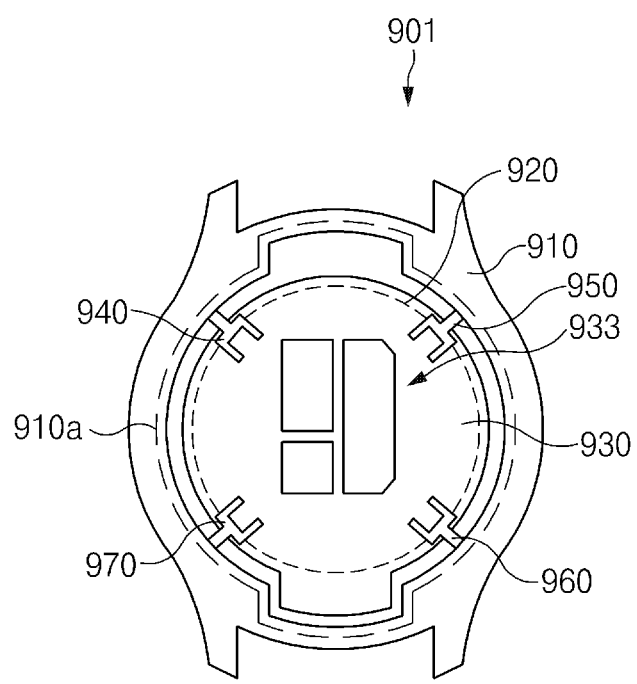
FIGS. 9A and 9B are illustrations of an electronic device in which switching circuits are connected to a plurality of feeding parts and a plurality of ground areas, according to an embodiment of the present disclosure.
Figure 9B:
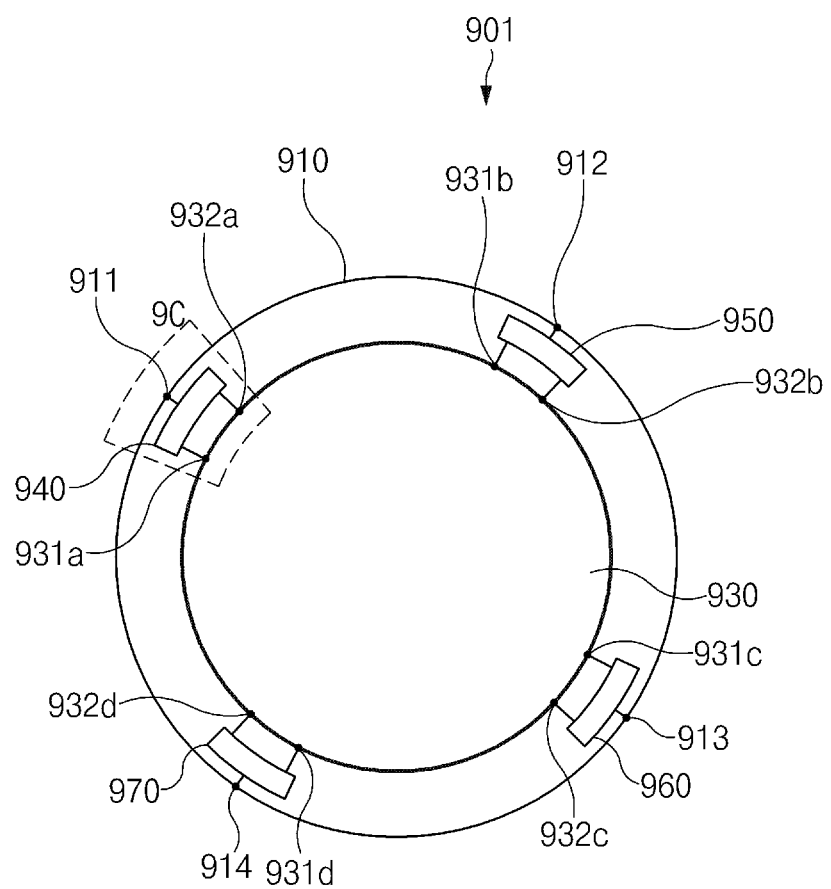

FIGS. 9A and 9B are illustrations of an electronic device 901 in which switching circuits are connected to a plurality of feeding parts and a plurality of ground areas, according to an embodiment of the present disclosure.

Referring to FIGS. 9A and 9B, the electronic device 901 includes a metal frame 910a of an outer housing 910 connected to feeding parts 931a, 931b, 931c, and 931d and ground areas 932a, 932b, 932c, and 932d. According to an embodiment of the present disclosure, the electronic device 901 may include the outer housing 910, a display 920, a PCB 930, and switching circuits 940, 950, 960, and 970.

With regard to FIGS. 9A and 9B, the descriptions of elements and operations that are duplicated with, correspond to, or are similar to the above-described contents are omitted. In other words, some elements and operations of the above-described contents may be applied to the embodiment of FIGS. 9A and 9B.

The PCB 930 may include the feeding parts 931a, 931b, 931c, and 931d, the ground areas 932a, 932b, 932c, and 932d, and a chip 933. The feeding parts 931a, 931b, 931c, and 931d and the ground areas 932a, 932b, 932c, and 932d may be connected to points 911, 912, 913, 914 of the metal frame 910a through the switching circuits 940, 950, 960, and 970, respectively.

Figure 9C:
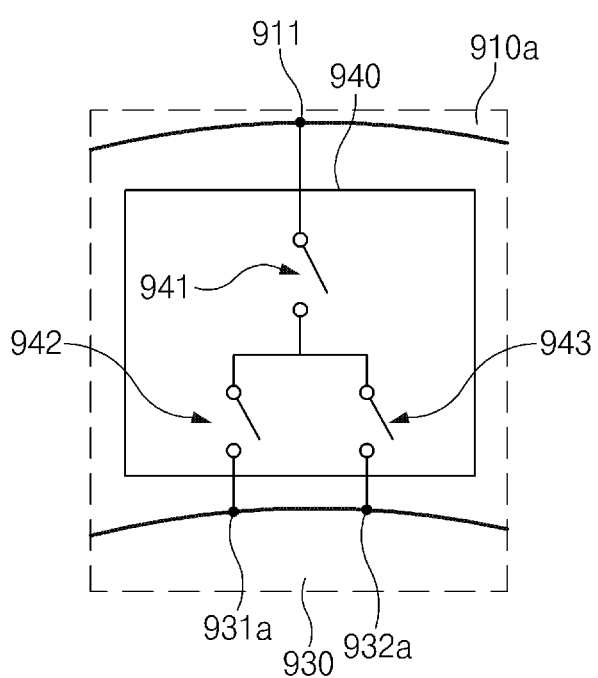
FIG. 9C is a partial view of the first switching circuit of the electronic device of FIG. 9B, according to an embodiment of the present disclosure.

FIG. 9C is a partial view of the first switching circuit 940 of the electronic device of FIG. 9B, according to an embodiment of the present disclosure.

Referring to FIG. 9C, the first switching circuit 940 may include a first switch 941, a second switch 942, and a third switch 943. For example, the first switch 941 may control a connection between the metal frame 910a and the PCB 930. For example, the second switch 942 may control a connection between the metal frame 910a and the first feeding part 931a. For example, the third switch 943 may control a connection between the metal frame 910a and the first ground area 932a. The switching circuits 940, 950, 960, and 970 that are respectively connected to the first to fourth points 911, 912, 913, and 914 may have the same structure. As such, the switching circuits 940, 950, 960, and 970 may, respectively, connect the points 911, 912, 913, and 914 to the feeding parts 931a, 931b, 931c, and 931d or the ground areas 932a, 932b, 932c, and 932d, or may not connect the points 911, 912, 913, and 914 to the feeding parts 931a, 931b, 931c, and 931d or the ground areas 932a, 932b, 932c, and 932d.

The chip 933 may include a control circuit that controls the communication circuit and the switching circuits 940, 950, 960, and 970.

Referring to FIG. 9B, the electronic device 901 may transmit/receive signals in multiple frequency bands by using at least a portion of the metal frame 910a of the outer housing 910.

According to an embodiment of the present disclosure, the chip 933 may control the plurality of switching circuits 940 to 970 to form various electrical paths. The communication circuit may transmit/receive signals of various frequency bands by forming resonance with various electrical paths.

For example, if the first point 911 is connected to the first feeding part 931a, the second point 912 is not connected to the second feeding part 931b and the second ground area 932b, the third point 913 is not connected to the third feeding part 931c and the third ground area 932c, and the fourth point 914 is connected to the fourth ground area 932d, as in the electronic device 301 of FIGS. 3A and 3B, the electronic device 901 may transmit/receive signals in multiple frequency bands.

For example, if the first point 911 is connected to the first feeding part 931a, the second point 912 is not connected to the second feeding part 931b and the second ground area 932c, the third point 913 is selectively connected with the third ground area 932c, and the fourth point 914 is connected to the fourth ground area 932d, as in the electronic device 401 of FIGS. 4A and 4B, the electronic device 901 may transmit/receive signals in multiple frequency bands.

For example, if the first point 911 is connected to the first feeding part 931a, the third point 913 and the fourth point 914 are, respectively, connected to the third ground area 932c and the fourth ground area 932d, the second point 912 is not connected to the second feeding part 931b and the second ground area 932b, and the impedance tuner 560 of FIG. 5C is installed at the second point 912, as in the electronic device 501 of FIGS. 5A and 5B, the electronic device 901 may transmit/receive signals in multiple frequency bands.

For example, if the first point 911 and the second point 912 are, respectively, connected to the first feeding part 931a and the second feeding part 931b, the third point 913 is connected to the third ground area 932c, and the fourth point 914 is not connected to the fourth feeding part 931d and the fourth ground area 932d, as in the electronic device 601 of FIGS. 6A and 6B, the electronic device 901 may transmit/receive signals in multiple frequency bands.

For example, if the first point 911 and the second point 912 are selectively, respectively, connected to the first feeding part 931a and the second feeding part 931b and the third point 913 is connected to the third ground area 932c, as in the electronic device 701 of FIGS. 7A and 7B, the electronic device 901 may transmit/receive signals in multiple frequency bands.

For example, if the first point 911 and the second point 912 are selectively, respectively, connected to the first feeding part 931a and the second feeding part 931b and the third point 913 is connected to the third ground area 932c, the second point 912 is connected with the second ground area 932b if the first point 911 is connected to the first feeding part 931a, and the first point 911 is connected to the first ground area 932a if the second point 912 is connected to the second feeding part 931b, the electronic device 901 may transmit/receive signals in multiple frequency bands as in the electronic device 801 of FIGS. 8A to 8D.

The electronic device 901 may control the plurality of switching circuits 940, 950, 960, and 970 to transmit/receive signals of multiple frequency bands.

Figure 10A:
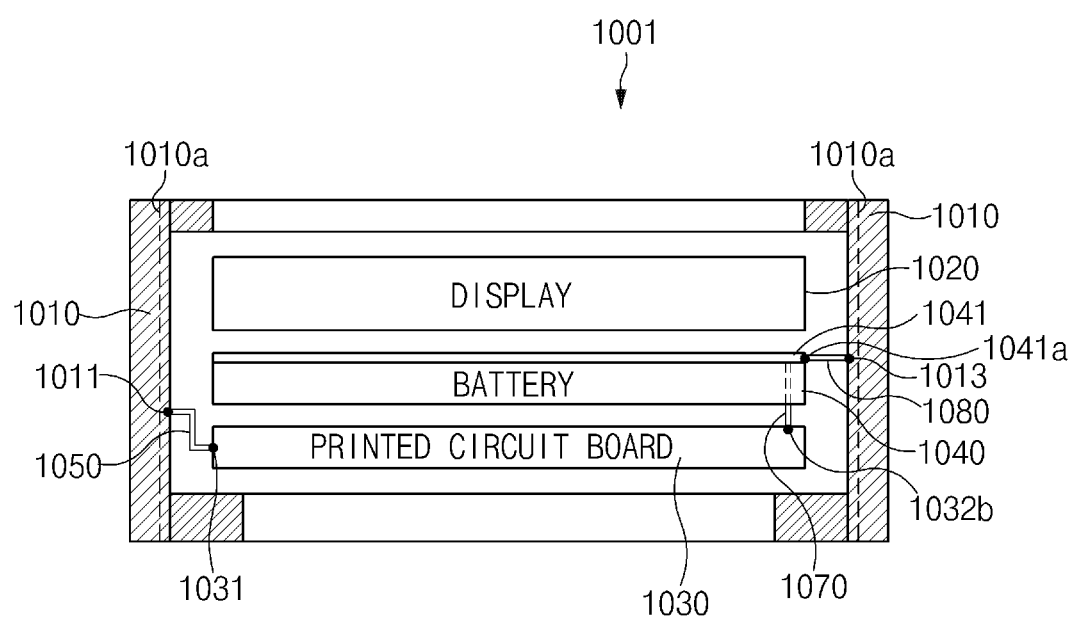

FIGS. 10A, 10B, 10C, 10D, and 10E are sectional views and illustrations of an electronic device 1001 that uses a battery structure as a ground, according to an embodiment of the present disclosure. FIGS. 10B and 10C show a front surface and a rear surface of the electronic device 1001, respectively.

Referring to FIGS. 10A, 10B, 10C, 10D, and 10E, the electronic device 1001 may include an outer housing 1010, a display 1020, a PCB 1030, a battery 1040, a feeding line 1050, a first ground line 1060, a second ground line 1070, and a switch 1080.

With regard to FIGS. 10A, 10B and 10C, the descriptions of elements and operations that are duplicated with, correspond to, or are similar to the above-described contents are omitted. In other words, some elements and operations of the above-described contents may be applied to the embodiment of FIGS. 10A and 10B.

The PCB 1030 may include a feeding part 1031, a first ground area 1032a, a second ground area 1032b, and a chip 1033. The feeding part 1031 may be electrically connected to a first point 1011 of a metal frame 1010a through the feeding line 1050. The first ground area 1032a may be electrically connected to a second point 1012 of the metal frame 1010a through the first ground line 1060. The second ground area 1032b may be electrically connected to a structure 1041 of the battery 1040 through the second ground line 1070. For example, the chip 1033 may include a control circuit that controls the communication circuit and the switch 1080.

The battery 1040 may be supplied with power from an external power source and may output the charged power to supply power for an operation of the electronic device 1001. For example, the battery 1040 may include the structure 1041 for supporting the battery 1040. For example, the structure 1041 may be electrically connected to the second ground area 1032b through the second ground line 1070.

According to an embodiment of the present disclosure, the structure 1041 may include a third ground area 1041a. The third ground area 1041a may be connected to a third point 1013 of the metal frame 1010a through the switch 1080. For example, the switch 1080 may control an electrical connection between the metal frame 1010a and the structure 1041 under control of the control circuit.

Figure 10D:
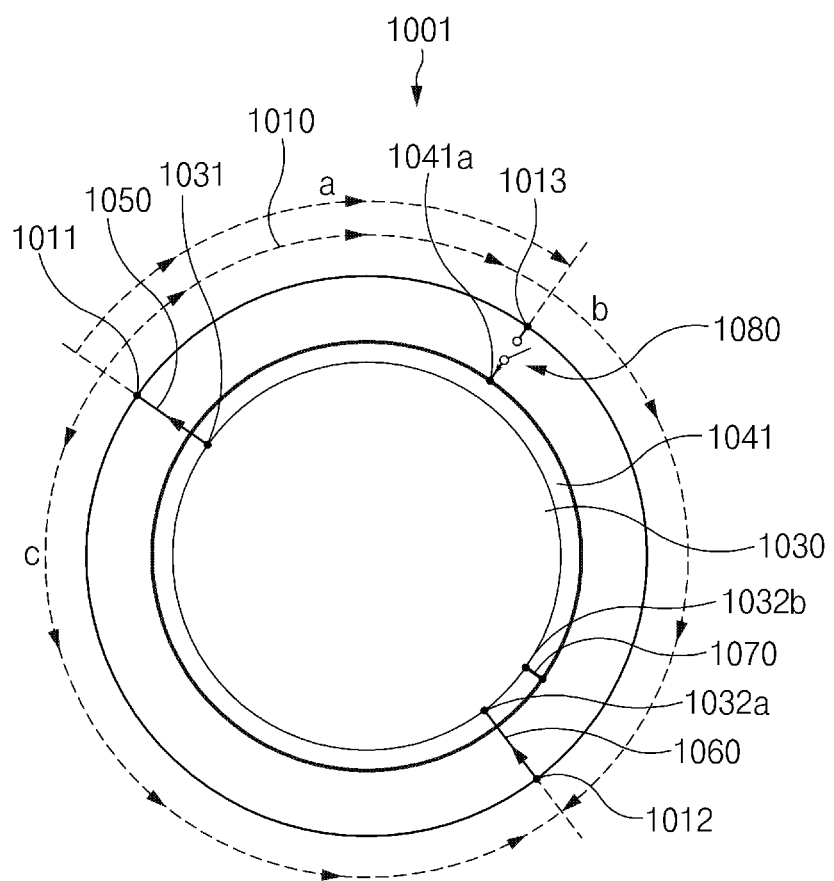
Figure 10E:
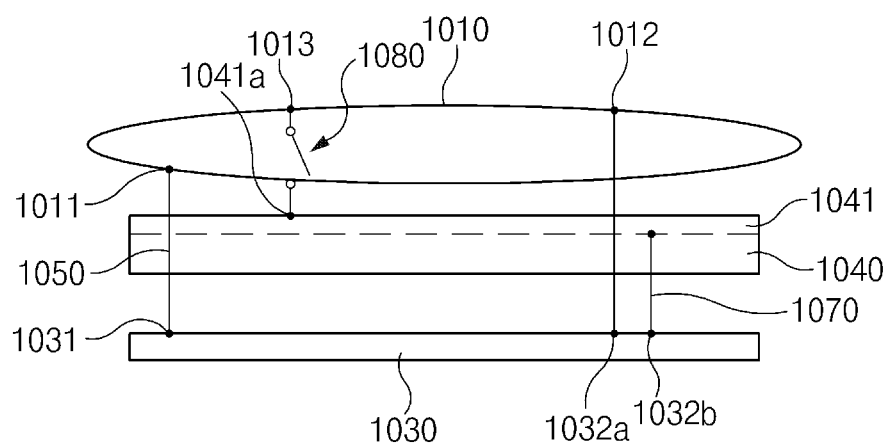

Referring to FIGS. 10D and 10E, the electronic device 1001 may transmit/receive signals in multiple frequency bands by using at least a portion of the metal frame 1010a of the outer housing 1010.

According to an embodiment of the present disclosure, if the third ground area 1041a is connected to the third point 1013 of the metal frame 1010a by the switch 1080 (e.g., if the switch 1080 is short-circuited), the communication circuit may transmit/receive a signal in a frequency band that corresponds to resonance through an electrical path formed between the first point 1011 and the third point 1013. For example, a first electrical path "a" from the feeding part 1031 to the third ground area 1041a through the first point 1011 and the third point 1013 may be formed. The communication circuit may transmit/receive a signal in a first frequency band corresponding to the first electrical path "a".

According to an embodiment of the present disclosure, if the third ground area 1041a is not connected to the third point 1013 of the metal frame 1010a by the switch 1080 (e.g., if the switch 1080 is opened (or off)), the communication circuit may transmit/receive a signal in a frequency band that corresponds to an electrical path formed between the first point 1011 and the second point 1012. For example, the second electrical path "b" from the feeding part 1031 to the first ground area 1032a through the first point 1101 and the second point 1012 may be formed. The communication circuit may transmit/receive a signal in a second frequency band corresponding to the second electrical path "b".

According to an embodiment of the present disclosure, in a case where the communication circuit includes a CA function, the communication circuit may transmit/receive a signal in a third frequency band through a third electrical path "c" formed between the first point 1011 and the second point 1012 in an opposite direction from the second electrical path "b" regardless of an operation of the switch 1080.

The electronic device 1001 may control the switch 1080 to transmit/receive signals of the first frequency band, the second frequency band, and the third frequency band. For example, the ground areas 1032a and 1032b of the PCB 1030 may be expanded by using the structure 1041 of the battery 1040, and the metal frame 1010a may be selectively connected to the expanded ground area 1041a. For example, an internal metal component of the electronic device 1001 may be used instead of the structure 1041 of the battery 1040.

Figure 11A:
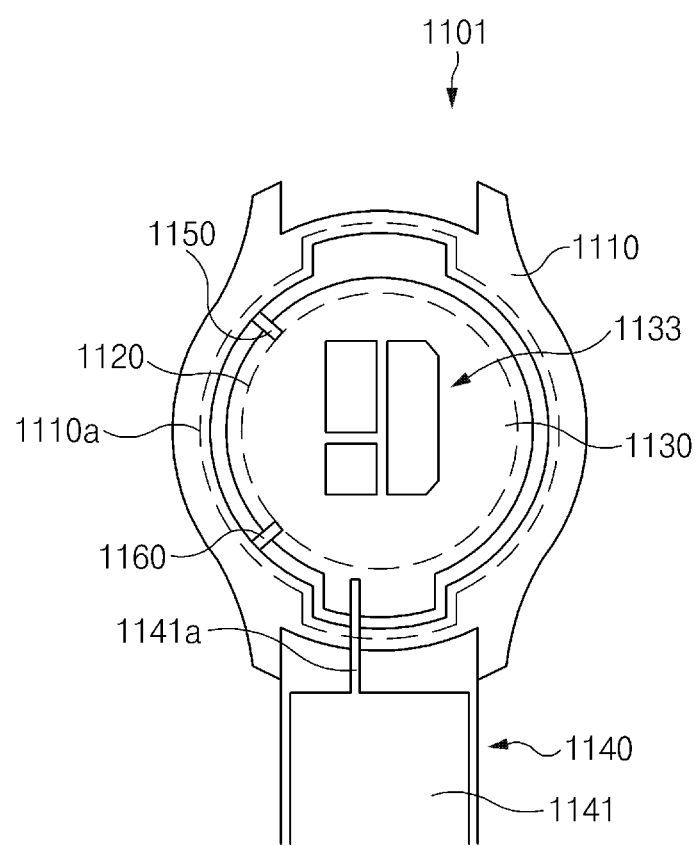
FIGS. 11A and 11B are illustrations of an electronic device that uses a strap as a ground, according to an embodiment of the present disclosure.
Figure 11B:
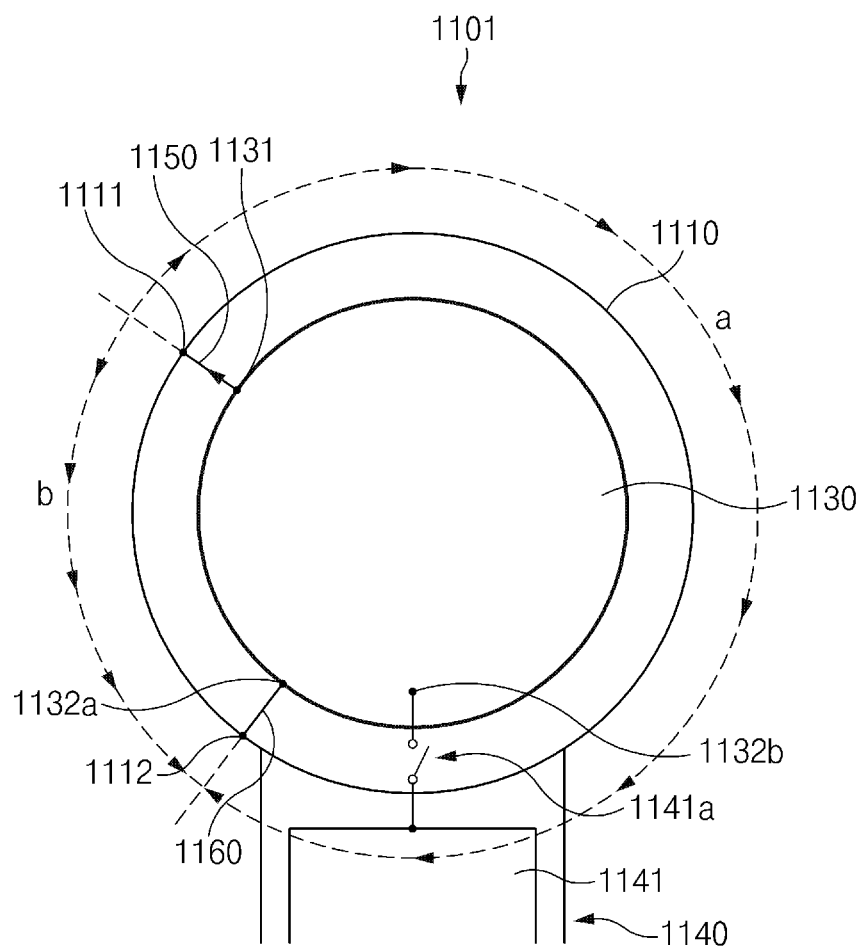

FIGS. 11A and 11B are illustrations of an electronic device 1101 that uses a strap as a ground, according to an embodiment of the present disclosure.

Referring to FIGS. 11A and 11B, the electronic device 1101 includes a metal frame 1110a of an outer housing 1110 that is connected to a metal area 1141 of a strap 1140. According to an embodiment of the present disclosure, the electronic device 1101 may include the outer housing 1110, a display 1120, a PCB 1130, a strap 1140, a feeding line 1150, and a ground line 1160.

With regard to FIGS. 11A and 11B, the descriptions of elements and operations that are duplicated with, correspond to, or are similar to the above-described contents are omitted. In other words, some elements and operations of the above-described contents may be applied to the embodiment of FIGS. 11A and 11B.

The PCB 1130 may include a feeding part 1131, a first ground area 1132a, a second ground area 1132b, and a chip 1133. The feeding part 1131 may be electrically connected to a first point 1111 of a metal frame 1110a through the feeding line 1150. The first ground area 1132a may be electrically connected to a second point 1112 of the metal frame 1110a through the ground line 1160. The second ground area 1132b may be connected to the metal area 1141 of the strap 1140 through a switch 1141a. For example, the chip 1133 may include a control circuit that controls the communication circuit and the switch 1141a, which is capable of supplying power to the metal frame 1110a.

The strap 1140 may be coupled to the outer housing 1110 so as to be mountable on a body of a user. For example, at least a portion of the strap 1140 may be formed of metal. The metal area 1141, which is formed of metal, of the strap 1140 may be connected to the second ground area 1132b through the switch 1141a. For example, the switch 1141a may control an electrical connection between the metal area 1141 and the second ground area 1132b under control of the control circuit.

Referring to FIG. 11B, the electronic device 1101 may transmit/receive signals in multiple frequency bands by using at least a portion of the metal frame 1110a of the outer housing 1110.

According to an embodiment of the present disclosure, if the second ground area 1132b is not connected to the metal area 1141 of the strap 1140 by the switch 1141a (e.g., if the switch 1141a is opened (or off)), the communication circuit may transmit/receive a signal in a frequency band that corresponds to an electrical path formed between the first point 1111 and the second point 1112. For example, a first electrical path "a" from the feeding part 1131 to the first ground area 1132a through the first point 1111 and the second point 1112 may be formed. The communication circuit may transmit/receive a signal in a first frequency band corresponding to the first electrical path "a". For example, in a case where the communication circuit includes a CA function, the communication circuit may transmit/receive a signal in a second frequency band through a second electrical path "b" formed between the first point 1111 and the second point 1112 in an opposite direction from the first electrical path "a".

According to an embodiment of the present disclosure, if the second ground area 1132b is connected to the metal area 1141 of the strap 1140 by the switch 1141a (e.g., if the switch 1141a is short-circuited), the second ground area 1132b formed in the PCB 1130 may be expanded to the metal area 1141. A frequency band of a signal that the communication circuit transmits/receives may be changed from the first frequency band and the second frequency band to a third frequency band and a fourth frequency band.

The electronic device 1101 may control the switch 1141a to transmit/receive signals of the first frequency band, the second frequency band, the third frequency band, and the fourth frequency band. For example, an internal or external metal component of the electronic device 1201 may be used instead of the strap 1140 for expansion of the ground areas 1132a and 1132b of the electronic device 1101.

Figure 12A:
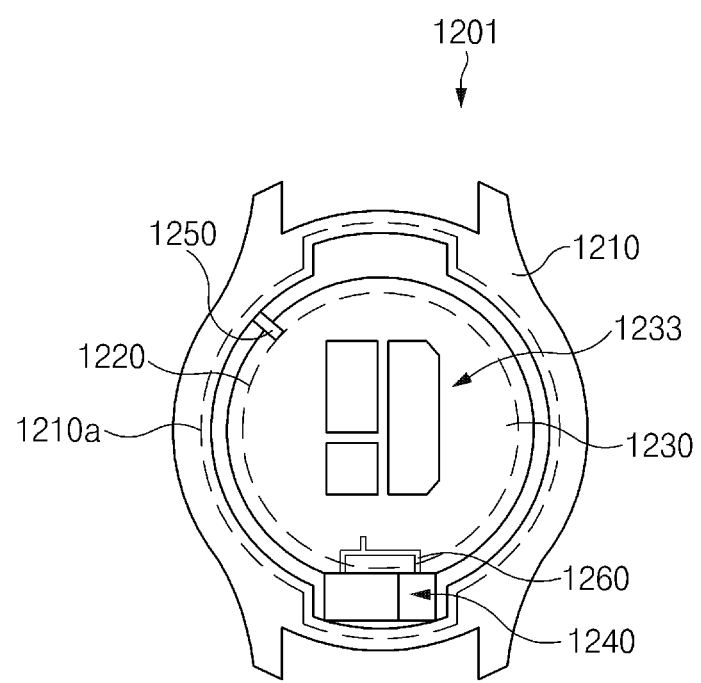
FIGS. 12A, 12B, and 12C are illustrations and a partial view of an electronic device in which a motor is connected to a ground area, according to an embodiment of the present disclosure.
Figure 12B:
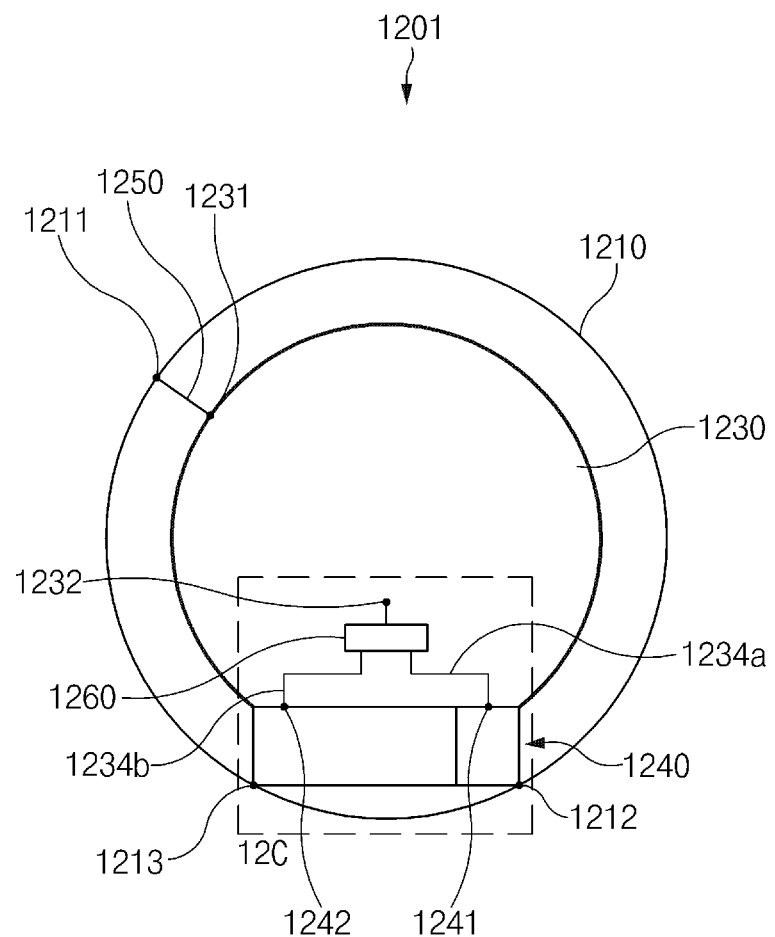
Figure 12C:
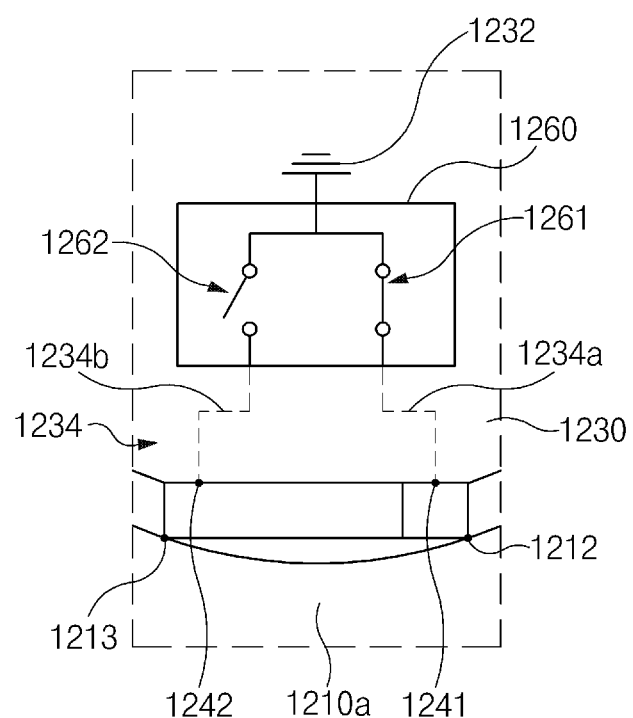

FIGS. 12A, 12B, and 12C are illustrations and a partial view of an electronic device 1201 in which a motor is connected to a ground area, according to an embodiment of the present disclosure.

Referring to FIGS. 12A, 12B, and 12C, the electronic device 1201 includes a metal frame 1210a of an outer housing 1210 that is connected to a ground area 1232 through a motor 1240. According to an embodiment of the present disclosure, the electronic device 1201 may include the outer housing 1210, a display 1220, a PCB 1230, the motor 1240, a feeding line 1250, and a switching circuit 1260.

With regard to FIGS. 12A and 12B, the descriptions of elements and operations that are duplicated with, correspond to, or are similar to the above-described contents are omitted. In other words, some elements and operations of the above-described contents may be applied to the embodiment of FIGS. 12A and 12B.

The PCB 1230 may include a feeding part 1231, the ground area 1232, a chip 1233, and wires 1234a and 1234b. The feeding part 1231 may be electrically connected to a first point 1211 of the metal frame 1210a through the feeding line 1250. The ground area 1232 may be connected to the motor 1240 through the switching circuit 1260 and the wires 1234a and 1234b. For example, the switching circuit 1260 may control an electrical connection between the motor 1240 and the ground area 1232 under control of the control circuit. For example, the chip 1233 may include a control circuit that controls the communication circuit and the switching circuit 1260.

According to an embodiment of the present disclosure, the switching circuit 1260 may include a first switch 1261 and a second switch 1262. The first switch 1261 may be connected to a first portion 1241 of the motor 1240 through the first wire 1234a. The second switch 1262 may be connected to a second portion 1242 of the motor 1240 through the second wire 1234b.

The motor 1240 may supply power needed for the electronic device 1201. According to an embodiment of the present disclosure, the motor 1240 may include the first portion 1241 and the second portion 1242. The first portion 1241 and the second portion 1242 may be opposite ends of the motor 1240. The first portion 1241 and the second portion 1242 may make contact with a second point 1212 and a third point 1213 of the metal frame 1210a. As such, the first portion 1241 and the second portion 1242 of the motor 1240 may be electrically connected to the metal frame 1210a at the second point 1212 and the third point 1213.

Referring to FIGS. 12B and 12C, the electronic device 1201 may transmit/receive signals in multiple frequency bands by using at least a portion of the metal frame 1210a of the outer housing 1210.

According to an embodiment of the present disclosure, the first switch 1261 and the second switch 1262 of the switching circuit 1260 may operate to be complementarity. For example, if the first switch 1261 connects the first portion 1241 of the motor 1240 to the ground area 1232 (e.g., if the first switch 1261 is short-circuited), the second switch 1262 may not connect the second portion 1242 of the motor 1240 to the ground area 1232 (e.g., the second switch 1262 is opened). For example, if the second switch 1262 connects the second portion 1242 of the motor 1240 to the ground area 1232 (e.g., if the second switch 1262 is short-circuited), the first switch 1261 may not connect the first portion 1241 of the motor 1240 to the ground area 1232 (e.g., the first switch 1261 is opened).

According to an embodiment of the present disclosure, if the first switch 1261 is short-circuited and the second switch 1262 is opened, a first electrical path connected from the feeding part 1231 to the ground area 1232 through the first point 1211, the first portion 1241, and the first wire 1234a may be formed. The communication circuit may transmit/receive a signal in a first frequency band corresponding to the first electrical path. In a case where the communication circuit includes a CA function, the communication circuit may transmit/receive a signal in a second frequency band through a second electrical path formed in an opposite direction from the first electrical path.

According to an embodiment of the present disclosure, if the first switch 1261 is opened and the second switch 1262 is short-circuited, a third electrical path connected from the feeding part 1231 to the ground area 1232 through the first point 1211, the third point 1213, the second portion 1242, and the second wire 1234b may be formed. The communication circuit may transmit/receive a signal in a third frequency band corresponding to the third electrical path. In a case where the communication circuit includes a CA function, the communication circuit may transmit/receive a signal in a fourth frequency band through a fourth electrical path formed in an opposite direction from the third electrical path.

The electronic device 1201 may transmit/receive a signal in any one of the first frequency band, the second frequency band, the third frequency band, and the fourth frequency band by using the motor 1240 as a portion of an electrical path. For example, an internal metal component of the electronic device 1201 may be used instead of the motor 1240.

According to an embodiment of the present disclosure, a way to use the motor 1240 as a portion of an electrical path may be applied to the electronic device 401 of FIGS. 4A and 4B. For example, the motor 1240 may make contact with the second point 412 and the third point 413 of the electronic device 401 to form an electrical path between the ground areas 432*a* and 432*b* and the metal frame 410*a*.

According to an embodiment of the present disclosure, a way to use the motor 1240 as a portion of an electrical path may be applied to the electronic device 501 of FIGS. 5A and 5B. For example, the motor 1240 may make contact with the first point 511 and the second point 512 of the electronic device 501 to form an electrical path between the ground areas 532*a* and 532*b* and the metal frame 510*a*.

Figure 13A:
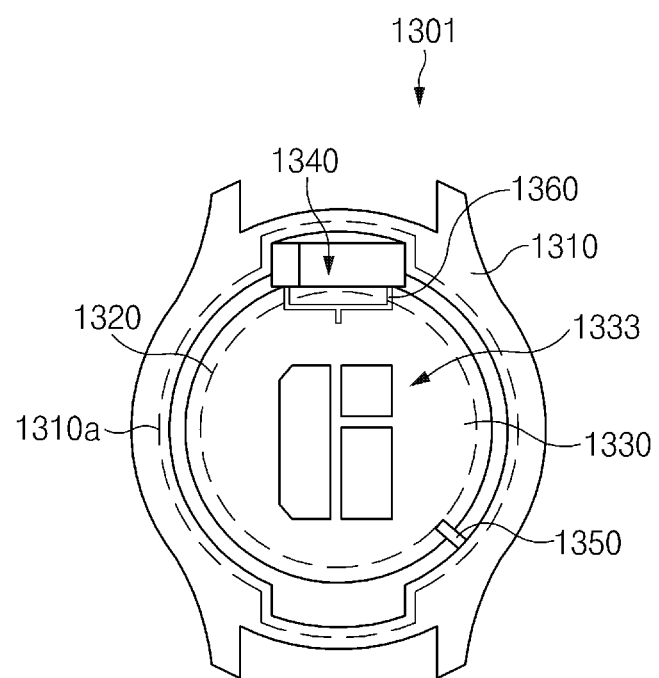
FIGS. 13A, 13B, and 13C are illustrations and a partial view of an electronic device in which a motor is connected to a feeding part, according to an embodiment of the present disclosure.
Figure 13B:
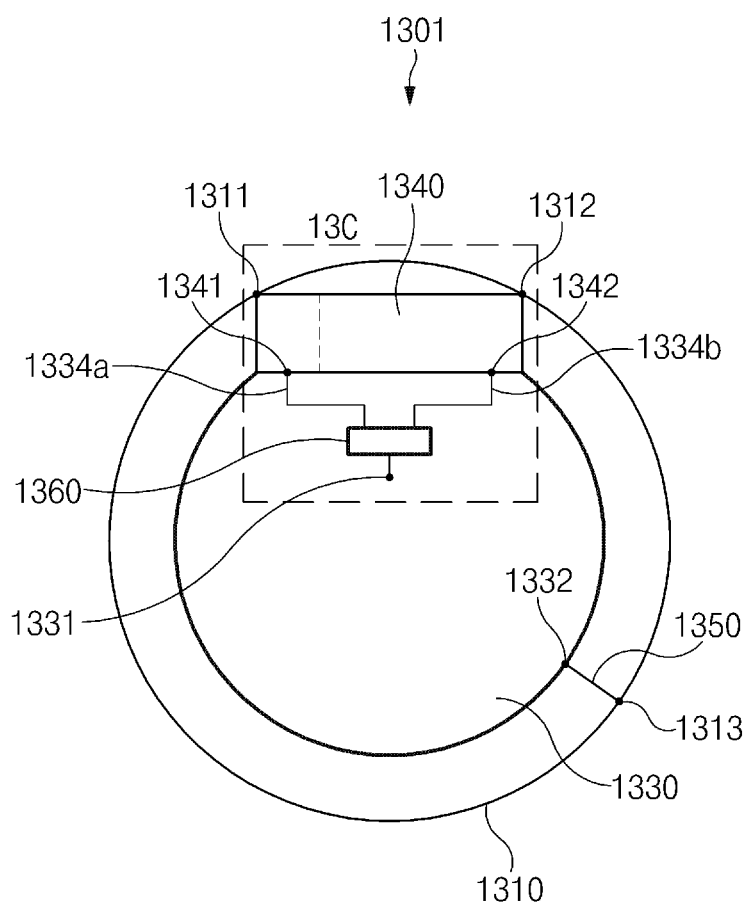
Figure 13C:
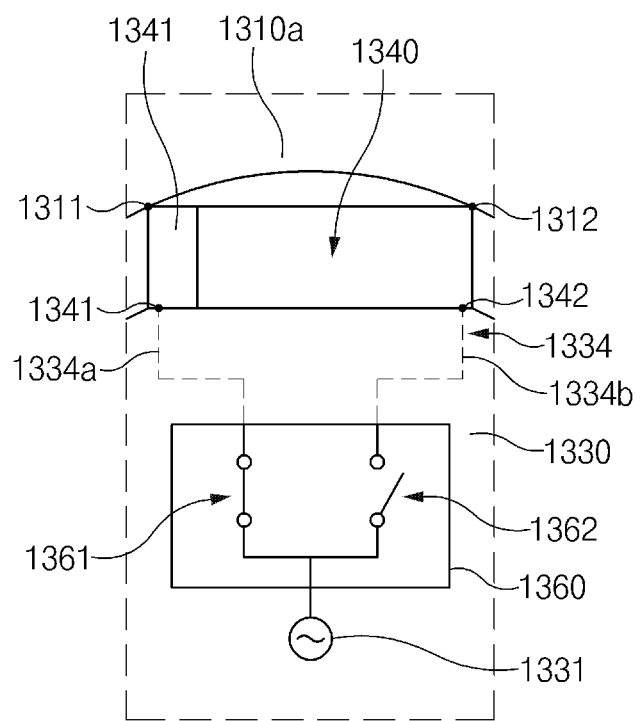

FIGS. 13A, 13B, and 13C are views illustrating an electronic device in which a motor is connected with a feeding part, according to an embodiment of the present invention. FIG. 13C illustrates an enlarged view of portion "F" of FIG. 13B.

Referring to FIGS. 13A, 13B, and 13C, the electronic device 1301 includes a metal frame 1310*a* of an outer housing 1310 is connected to a feeding part 1331 through a motor 1340. According to an embodiment of the present disclosure, the electronic device 1301 may include the outer housing 1310, a display 1320, a PCB 1330, the motor 1340, a ground line 1350, and a switching circuit 1360.

With regard to FIGS. 13A and 13B, the descriptions of elements and operations that are duplicated with, correspond to, or are similar to the above-described contents are omitted. In other words, some elements and operations of the above-described contents may be applied to the embodiment of FIGS. 13A and 13B.

The PCB 1330 may include a feeding part 1331, a ground area 1332, chip 1333, and wires 1334*a* and 1334*b*. The feeding part 1331 may be connected to the motor 1340 through the switching circuit 1360 and the wires 1334*a* and 1334*b*. For example, the switching circuit 1360 may control an electrical connection between the motor 1340 and the feeding part 1331 under control of the control circuit. The ground area 1332 may be electrically connected to a third point 1313 of the metal frame 1310 through the ground line 1350. The chip 1333 may include a control circuit that controls the communication circuit and the switching circuit 1360.

According to an embodiment of the present disclosure, the switching circuit 1360 may include a first switch 1361 and a second switch 1362. The first switch 1361 may be connected to a first portion 1341 of the motor 1340 through the first wire 1334*a*. The second switch 1362 may be connected to a second portion 1342 of the motor 1340 through the second wire 1334*b*.

The motor 1340 may supply power needed for the electronic device 1301. According to an embodiment of the present disclosure, the motor 1340 may include the first portion 1341 and the second portion 1342. The first portion 1341 and the second portion 1342 may be opposite ends of the motor 1340. The first portion 1341 and the second portion 1342 may make contact with a first point 1311 and a second point 1312 of the metal frame 1310*a*. As such, the first portion 1341 and the second portion 1342 of the motor 1340 may be electrically connected to the metal frame 1310*a*.

According to an embodiment of the present disclosure, the motor 1340 may be disposed in the interior of the outer housing 1310 and may make contact with the metal frame 1310*a* at the first point 1311 and the second point 1312. For example, at least a portion of the motor 1340 may be formed of a conductive material. As such, the first portion 1341 and the second portion 1342 of the motor 1340 may be electrically connected to the metal frame 1310*a* at the first point 1311 and the second point 1312.

Referring to FIGS. 13B and 13C, the electronic device 1301 may transmit/receive signals in multiple frequency bands by forming an electrical path using at least a portion of the metal frame 1310*a* of the outer housing 1310.

According to an embodiment of the present disclosure, the first switch 1361 and the second switch 1362 of the switching circuit 1360 may operate to be complementarity. For example, if the first switch 1361 connects the first portion 1341 of the motor 1340 to the feeding part 1331 (e.g., if the first switch 1361 is short-circuited), the second switch 1362 may not connect the second portion 1342 of the motor 1340 to the feeding part 1331 (e.g., the second switch 1362 is opened). For example, if the second switch 1362 connects the second portion 1342 of the motor 1340 to the feeding part 1331 (e.g., if the second switch 1362 is short-circuited), the first switch 1361 may not connect the first portion 1341 of the motor 1340 to the feeding part 1331 (e.g., the first switch 1361 is opened).

According to an embodiment of the present disclosure, if the first switch 1361 is short-circuited and the second switch 1362 is opened, a first electrical path connected from the feeding part 1331 to the ground area 1332 through the first wire 1334*a*, the first portion 1341, and the third point 1313 may be formed. The communication circuit may transmit/receive a signal in a first frequency band corresponding to the first electrical path. In a case where the communication circuit includes a CA function, the communication circuit may transmit/receive a signal in a second frequency band through a second electrical path formed in an opposite direction from the first electrical path.

According to an embodiment of the present disclosure, if the first switch 1361 is opened and the second switch 1362 is short-circuit, a third electrical path connected from the feeding part 1331 to the ground area 1332 through the second wire 1334*b*, the second portion 1342, and the third point 1313 may be formed. The communication circuit may transmit/receive a signal in the third frequency band corresponding to the third electrical path. In a case where the communication circuit includes the CA function, the communication circuit may transmit/receive a signal in a fourth frequency band through a fourth electrical path formed in an opposite direction from the third electrical path.

The electronic device 1301 may transmit/receive signals of the first frequency band, the second frequency band, the third frequency band, and the fourth frequency band by using the motor 1340 as a portion of an electrical path. For example, an internal metal component of the electronic device 1301 may be used instead of the motor 1340.

According to an embodiment of the present disclosure, a way to use the motor 1340 as a portion of an electrical path may be applied to the electronic device 601 of FIGS. 6A and 6B. For example, the motor 1340 may make contact with the first point 611 and the second point 612 of the electronic device 601 to form an electrical path between the feeding parts 631*a* and 631*b* and the metal frame 610*a*.

Figure 14A:
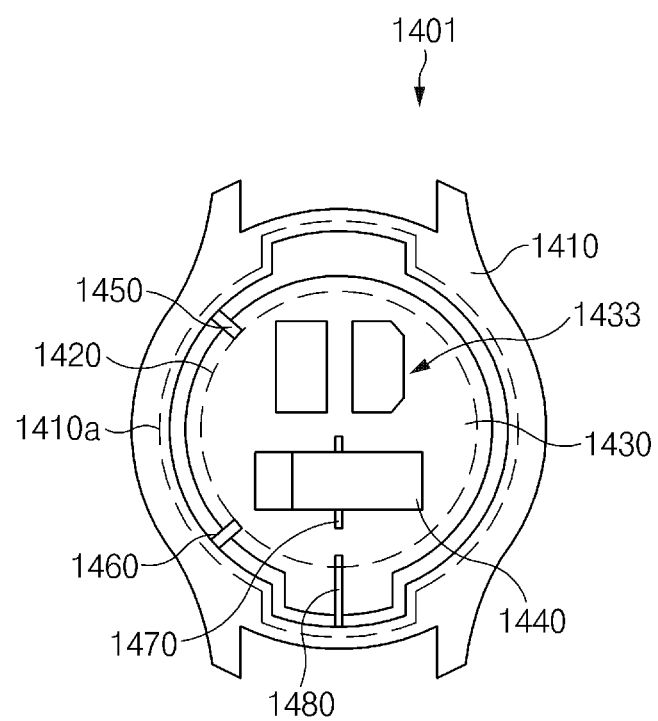
FIGS. 14A, 14B, and 14C are illustrations and a partial view of an electronic device in which a motor is connected to a metal frame through a connection member, according to an embodiment of the present disclosure.
Figure 14B:
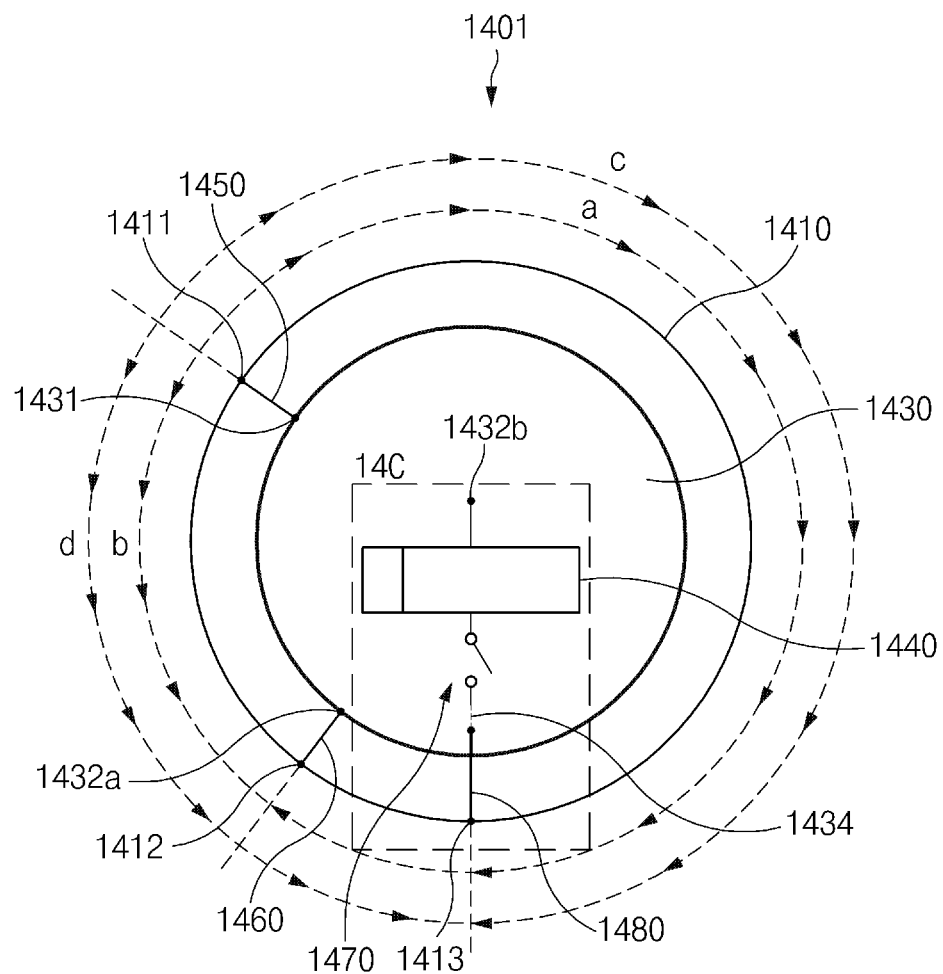
Figure 14C:
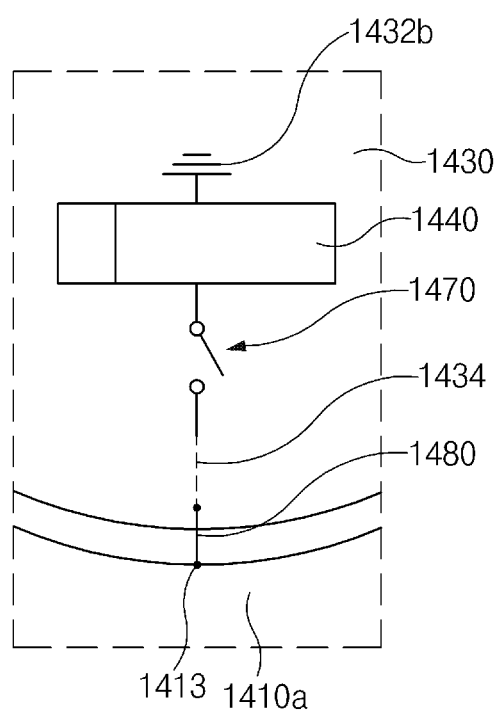

FIGS. 14A, 14B, and 14C are illustrations and a partial view of an electronic device 1401 in which a motor is connected to a metal frame through a connection member, according to an embodiment of the present disclosure.

Referring to FIGS. 14A, 14B, and 14C, the electronic device 1401 includes a metal frame 1410*a* of an outer housing 1410 is connected to a motor 1440 through a connection member 1480. According to an embodiment of the present disclosure, the electronic device 1401 may include the outer housing 1410, a display 1420, a PCB 1430, the motor 1440, a feeding line 1450, a ground line 1460, a switch 1470, and the connection member 1480.

With regard to FIGS. 14A and 14B, the descriptions of elements and operations that are duplicated with, correspond to, or are similar to the above-described contents are omitted. In other words, some elements and operations of the above-described contents may be applied to the embodiment of FIGS. 14A and 14B.

The PCB 1430 may include a feeding part 1431, a first ground part 1432*a*, a second ground area 1432*b*, a chip 1433, and a wire 1434. The feeding part 1431 may be electrically connected to a first point 1411 of the metal frame 1410*a* through the feeding line 1450. The first ground area 1432*a* may be electrically connected to a second point 1412 of the metal frame 1410*a* through the ground line 1460. The second ground area 1432*b* may be connected to a third point 1413 of the metal frame 1410*a* through the motor 1440, the wire 1434, the switch 1470, and the connection member 1480. The chip 1433 may include a control circuit that controls the communication circuit and the switch 1470.

The motor 1440 may supply power needed for the electronic device 1401. According to an embodiment of the present disclosure, the motor 1440 may not make contact with the metal frame 1410*a*. For example, the motor 1440 may be directly connected to the second ground area 1432*b* and may be electrically connected to the metal frame 1410*a* through the wire 1434.

One end of the connection member 1480 may make contact with the third point 1413 of the metal frame 1410*a* so as to be electrically connected to the metal frame 1410*a*, and an opposite end of the connection member 1480 may be connected to a wire pattern 1434 of the PCB 1430. For example, the connection member 1480 may be a C-clip capable of forming an electrical connection. As such, the connection member 1480 may be connected to the motor 1440 through the switch 1470.

Referring to FIGS. 14B and 14C, the electronic device 1401 may transmit/receive a frequency signal in a multi-band by using at least a portion of the metal frame 1410*a* of the outer housing 1410.

According to an embodiment of the present disclosure, if the second ground area 1432*b* is not connected to the metal frame 1410*a* by the switch 1470 (e.g., if the switch 1470 is opened (or off)), the communication circuit may transmit/receive a signal in a frequency band that corresponds to an electrical path formed between the first point 1411 and a second point 1412. For example, a first electrical path "a" from the feeding part 1431 to the ground area 1432*a* through the first point 1411 and the second point 1412 may be formed. The communication circuit may transmit/receive a signal in a first frequency band corresponding to the first electrical path "a". For example, in a case where the communication circuit includes a CA function, the communication circuit may transmit/receive a signal in a second frequency band through a second electrical path "b" formed between the first point 1411 and the second point 1412 in an opposite direction from the first electrical path "a".

According to an embodiment of the present disclosure, if the second ground area 1432*b* is connected to the metal frame 1410*a* by the switch 1470 (e.g., if the switch 1470 is short-circuited), the communication circuit may transmit/receive a signal in a frequency band that corresponds to an electrical path formed between the first point 1411, the second point 1412, and the third point 1413. For example, a third electrical path "c" that is connected from the feeding part 1431 to the second ground area 1432 through the first point 1411, the third point 1434, the connection member 1480, the wire 1434, and the motor 1440 may be formed. The communication circuit may transmit/receive a signal in the third frequency band corresponding to the third electrical path "c". In a case where the communication circuit includes the CA function, the communication circuit may transmit/receive a signal in a fourth frequency band through a fourth electrical path "d" formed between the first point 1411 and the third point 1413 in an opposite direction from the third electrical path "c".

The electronic device 1401 may transmit/receive signals of the first frequency band, the second frequency band, the third frequency band, and the fourth frequency band by using the motor 1440 as a portion of an electrical path without a direct contact with the metal frame 1410*a*. For example, an internal metal component of the electronic device 1401 may be used instead of the motor 1440.

According to an embodiment of the present disclosure, a way to use the motor 1440 as a portion of an electrical path may be applied to the electronic device 301 of FIGS. 3A and 3B. For example, the motor 1440 may form an electrical path between the ground area 332 and the metal frame 310*a* of the electronic device 301.

According to an embodiment of the present disclosure, a way to use the motor 1440 as a portion of an electrical path may be applied to the electronic device 401 of FIGS. 4A and 4B. For example, the motor 1440 may form an electrical path between the second ground area 432*b* and the metal frame 410*a* of the electronic device 401.

An wearable device according to various embodiments may include an outer housing that includes a first surface facing a first direction, a second surface facing a second direction opposite to the first direction, and a side surface surrounding a space between the first surface and the second surface, wherein a metal frame is formed on at least a portion of the side surface, a display at least a portion of which is exposed through the first surface of the outer housing, a printed circuit board (PCB) that is interposed between the second surface and the display in the interior of the outer housing, a communication circuit that is disposed on the PCB, and a ground area that is provided in the PCB. The metal frame may be electrically connected with the communication circuit at a first point of the metal frame and may be selectively connected with the ground area at a second point of the metal frame. The communication circuit may be configured to transmit/receive a signal in a first frequency band by a first electrical path formed when the second point is not connected with the ground area, and to transmit/receive a signal in a second frequency band by a second electrical path formed when the second point is connected with the ground area.

The wearable device according to various embodiments may further include an impedance tuner interposed between the second point of the metal frame and the ground area. The impedance tuner may be connected to any one of a port to which an impedance including at least one of an inductor and a capacitor is connected and a port connected to the ground area.

The wearable device according to various embodiments, the metal frame may be electrically connected with the ground area at a third point having an electrical length different from the second electrical path, with respect to the first point.

The wearable device according to various embodiments may further include an impedance tuner that is interposed between the third point of the metal frame and the ground area. The impedance tuner may be connected to any one of a port to which an impedance including at least one of an inductor and a capacitor is connected and a port connected to the ground area.

The wearable device according to various embodiments may further include a metal component that is disposed in the interior of the outer housing and makes contact with and is electrically connected with the second point and the third point, and a switching circuit that includes a first switch and a second switch that control a connection between the metal component and the ground area. The metal component and the ground area may be electrically connected by any one of the first switch and the second switch.

The wearable device according to various embodiments, opposite ends of the metal component may be connected to the metal frame, and the first switch and the second switch may be respectively connected to the opposite ends of the metal component.

The wearable device according to various embodiments may further include a strap that is connected to the outer housing, wherein at least a portion of the strap is formed of metal, and a switch that controls a connection between the ground area and an area, which is formed of the metal, of the strap. The wearable device may be configured to transmit/receive a signal in a frequency band changed when the area, which is formed of the metal, of the strap and the ground area are electrically connected by the switch.

The wearable device according to various embodiments may further include a metal component that is disposed in the interior of the outer housing and connected with the ground area, and a switch that controls a connection between the metal component and the second point.

The wearable device according to various embodiments may further include a connection member that is electrically connecting the second point to a conductive pattern of the PCB, a metal component that is disposed in the interior of the outer housing and connected with the ground area, and a switch that controls a connection between the conductive pattern and the metal component.

An wearable device according to various embodiments may include an outer housing including a first surface facing a first direction, a second surface facing a second direction opposite to the first direction, and a side surface surrounding a space between the first surface and the second surface, wherein a metal frame is formed on at least a portion of the side surface, a display at least a portion of which is exposed through the first surface of the outer housing, a printed circuit board (PCB) interposed between the second surface and the display in the interior of the outer housing, a communication circuit disposed on the PCB, and a ground area provided in the PCB. The metal frame may be electrically connected with the communication circuit at a first point and a second point of the metal frame. The metal frame may be electrically connected with the ground area at a third point having different electrical lengths with respect to the first point and the second point. The communication circuit may be configured to transmit/receive a signal in a first frequency band by a first electrical path formed between the first point and the third point, and to transmit/receive a signal in a second frequency band by a second electrical path formed between the second point and the third point.

The wearable device according to various embodiment, the metal frame may be electrically connected with the communication circuit at any one of the first point and the second point.

The wearable device according to various embodiments may further include a switching circuit connected with the communication circuit and the ground area at the first point and the second point respectively. The switching circuit may be configured to electrically connect any one of the first point and the second point with the communication circuit, and to electrically connect the communication circuit to the ground area when the first point and the second point are not electrically connected with the communication circuit.

The wearable device according to various embodiments, the switching circuit may include a first switch that controls a connection between the communication circuit and the metal frame, and a second switch that controls a connection between the communication circuit and the ground area.

The wearable device according to various embodiments may further include a metal component that is disposed in the interior of the outer housing and makes contact with and is electrically connected with the first point and the second point, and a switching circuit including a first switch and a second switch that control a connection between the metal component and the communication circuit. The metal component and the communication circuit may be electrically connected by any one of the first switch and the second switch.

The wearable device according to various embodiments, opposite ends of the metal component may be connected to the metal frame, and the first switch and the second switch may be respectively connected to the opposite ends of the metal component.

An wearable device according to various embodiments may include an outer housing including a first surface facing a first direction, a second surface facing a second direction opposite to the first direction, and a side surface surrounding a space between the first surface and the second surface, wherein a metal frame is formed on at least a portion of the side surface, a display at least a portion of which is exposed through the first surface of the outer housing, a printed circuit board (PCB) interposed between the second surface and the display in the interior of the outer housing, a communication circuit disposed on the PCB, a ground area provided in the PCB, and a switching circuit connected between the communication circuit, the ground area, and the metal frame at a first point, a second point, and a third point of the metal frame, the third point having different electrical lengths with respect to the first point and the second point. The communication circuit may be configured to transmit/receive a signal in a multiple frequency band at the first point, the second point, and the third point based on an electrical connection with the communication circuit and the ground area.

The wearable device according to various embodiments, the switching circuit may include a first switch that controls a connection between the communication circuit and the metal frame, a second switch that controls a connection between the ground area and the metal frame, and a third switch that controls a connection between the PCB and the metal frame.

The wearable device according to various embodiments, the metal frame may be electrically connected with the communication circuit at the first point, may be selectively connected with the ground area at the second point, and may be electrically connected with the ground area at the third point. The communication circuit may be configured to transmit/receive a signal in a first frequency band by a first electrical path formed when the second point is not connected with the ground area, and to transmit/receive a signal in a second frequency band by a second electrical path formed when the second point is connected with the ground area.

The wearable device according to various embodiments, the metal frame may be electrically connected with the communication circuit at the first point and the second point and may be electrically connected with the ground area at the third point. The communication circuit may be configured to transmit/receive a signal in a first frequency band by a first electrical path formed between the first point and the third point, and to transmit/receive a signal in a second frequency band by a second electrical path formed between the second point and the third point.

The wearable device according to various embodiments, the metal frame may be electrically connected with the communication circuit at any one of the first point and the second point.

Figure 15:
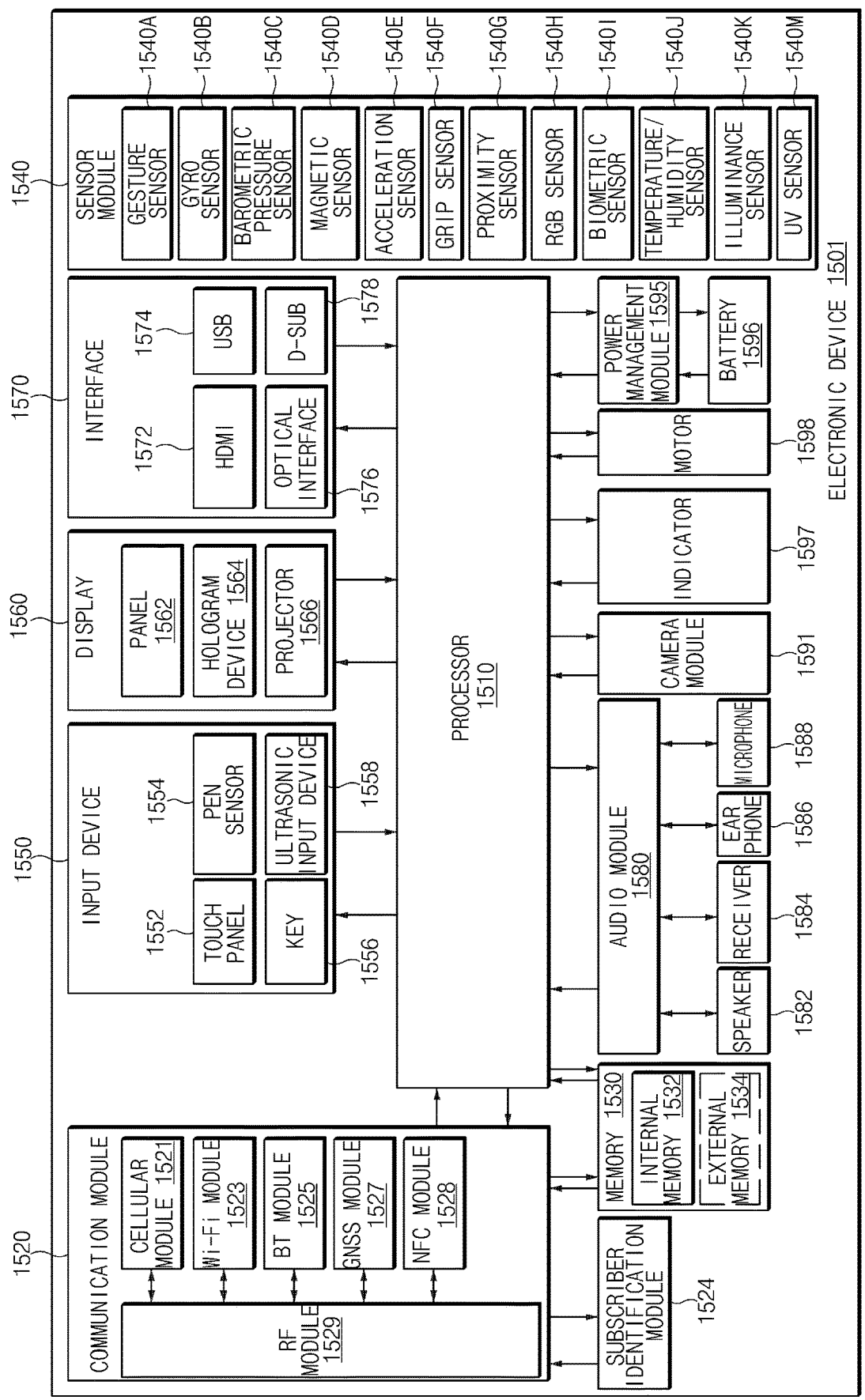
FIG. 15 is a block diagram of an electronic device, according to an embodiment of the present disclosure.

FIG. 15 is a block diagram of an electronic device 1501, according to an embodiment of the present disclosure.

Referring to FIG. 15, the electronic device 1501 may include, for example, all or a part of the electronic device illustrated in FIG. 1. The electronic device 1501 may include one or more processors (e.g., an AP) 1510, a communication module 1520, a subscriber identification module 1524, a memory 1530, a sensor module 1540, an input device 1550, a display 1560, an interface 1570, an audio module 1580, a camera module 1591, a power management module 1595, a battery 1596, an indicator 1597, and a motor 1598.

The processor 1510 may drive, for example, an OS or an application to control a plurality of hardware or software elements connected to the processor 1510 and may process and compute a variety of data. For example, the processor 1510 may be implemented with a system on chip (SoC). According to an embodiment of the pres ent disclosure, the processor 1510 may further include a graphics processing unit (GPU) and/or an image signal processor. The processor 1510 may include at least a part (e.g., a cellular module 1521) of elements illustrated in FIG. 15. The processor 1510 may load an instruction or data, which is received from at least one of the other elements (e.g., a nonvolatile memory), into a volatile memory and process the loaded instruction or data. The processor 1510 may store a variety of data in the nonvolatile memory.

The communication module 1520 may include the cellular module 1521, a Wi-Fi module 1523, a Bluetooth (BT) module 1525, a GNSS module 1527 (e.g., a GPS module, a Glonass module, a Beidou module, or a Galileo module), a near field communication (NFC) module 1528 and a radio frequency (RF) module 1529.

The cellular module 1521 may provide, for example, voice communication, video communication, a character service, an Internet service, or the like over a communication network. According to an embodiment of the present disclo sure, the cellular module 1521 may perform discrimination and authentication of the electronic device 1501 within a communication network by using the subscriber identification module (e.g., a SIM card) 1524. The cellular module 1521 may perform at least a portion of the functions that the processor 1510 provides. The cellular module 1521 may include a CP.

Each of the Wi-Fi module 1523, the BT module 1525, the GNSS module 1527, or the NFC module 1528 may include a processor for processing data exchanged through a corresponding module, for example. According to an embodiment of the present disclosure, at least a part (e.g., two or more) of the cellular module 1521, the Wi-Fi module 1523, the BT module 1525, the GNSS module 1527, or the NFC module 1528 may be included within one IC or an IC package.

For example, the RF module 1529 may transmit and receive a communication signal (e.g., an RF signal). For example, the RF module 1529 may include a transceiver, a power amplifier module (PAM), a frequency filter, a low noise amplifier (LNA), an antenna, or the like. According to an embodiment of the present disclosure, at least one of the cellular module 1521, the Wi-Fi module 1523, the BT module 1525, the GNSS module 1527, or the NFC module 1528 may transmit and receive an RF signal through a separate RF module.

The subscriber identification module 1524 may include, for example, a card and/or embedded SIM and may include unique identify information (e.g., an IC card identifier (ICCID)) or subscriber information (e.g., an integrated mobile subscriber identity (IMSI)).

The memory 1530 may include an internal memory 1532 or an external memory 1534. For example, the internal memory 1532 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 1534 may further include a flash drive such as a compact flash (CF) drive, a secure digital (SD) memory card, a micro secure digital (Micro-SD) memory card, a mini secure digital (Mini-SD) memory card, an extreme digital (xD) memory card, a multimedia card (MMC), a memory stick, or the like. The external memory 1534 may be operatively and/or physically connected to the electronic device 1501 through various interfaces.

The sensor module 1540 may measure, for example, a physical quantity or may detect an operation state of the electronic device 1501. The sensor module 1540 may convert measured or detected information to an electrical signal. For example, the sensor module 1540 may include at least one of a gesture sensor 1540A, a gyro sensor 1540B, a barometric pressure sensor 1540C, a magnetic sensor 1540D, an acceleration sensor 1540E, a grip sensor 1540F, a proximity sensor 1540G, a color sensor 1540H (e.g., a red, green, blue (RGB) sensor), a biometric sensor 1540I, a temperature/humidity sensor 1540J, an illuminance sensor 1540K, or an ultra violet (UV) light sensor 1540M. Additionally or alternatively, the sensor module 1540 may further include, for example, an electronic nose (E-nose) sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1540 may further include a control circuit for controlling at least one or more sensors included therein. According to an embodiment of the present disclosure, the electronic device 1501 may further include a processor that is a part of the processor 1510 or independent of the processor 1510 and is configured to control the sensor module 1540. The processor may control the sensor module 1540 while the processor 1510 remains in a reduced power or sleep state.

The input device 1550 may include, for example, a touch panel 1552, a (digital) pen sensor 1554, a key 1556, or an ultrasonic input unit 1558. For example, the touch panel 1552 may use at least one of capacitive, resistive, infrared and ultrasonic detecting methods. In addition, the touch panel 1552 may further include a control circuit. The touch panel 1552 may further include a tactile layer to provide a tactile reaction to a user.

The (digital) pen sensor 1554 may be, for example, a part of a touch panel or may include an additional sheet for recognition. The key 1556 may include, for example, a physical button, an optical key, a keypad, or the like. The ultrasonic input device 1558 may detect (or sense) an ultrasonic signal, which is generated from an input device, through a microphone 1588 and may check data corresponding to the detected ultrasonic signal.

The display 1560 may include a panel 1562, a hologram device 1564, or a projector 1566. The panel 1562 may be implemented, for example, to be flexible, transparent or wearable. The panel 1562 and the touch panel 1552 may be integrated into a single module. The hologram device 1564 may display a stereoscopic image in a space using a light interference phenomenon. The projector 1566 may project light onto a screen so as to display an image. For example, the screen may be arranged in the inside or the outside of the electronic device 1501. According to an embodiment of the present disclosure, the display 1560 may further include a control circuit for controlling the panel 1562, the hologram device 1564, or the projector 1566.

The interface 1570 may include, for example, a high-definition multimedia interface (HDMI) 1572, a universal serial bus (USB) 1574, an optical interface 1576, or a D-subminiature (D-sub) connector 1578. Additionally or alternatively, the interface 1570 may include, for example, a mobile high definition link (MHL) interface, an SD memory card/MMC interface, or an Infrared Data Association (IrDA) standard interface.

The audio module 1580 may convert a sound and an electrical signal in dual directions. The audio module 1580 may process, for example, sound information that is input or output through a speaker 1582, a receiver 1584, an earphone 1586, or the microphone 1588.

For example, the camera module 1591 may record a still image or a video. According to an embodiment of the present disclosure, the camera module 1591 may include at least one or more image sensors (e.g., a front sensor or a rear sensor), a lens, an image signal processor (ISP), or a flash (e.g., an LED or a xenon lamp). The power management module 1595 may manage, for example, the power of the electronic device 1501. According to an embodiment of the present disclosure, a power management IC (PMIC), a charger IC, or a battery gauge may be included in the power management module 1595. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 1596 and a voltage, current or temperature thereof while the battery 1596 is charged. The battery 1596 may include, for example, a rechargeable battery and/or a solar battery.

The indicator 1597 may display a certain state of the electronic device 1501 or a part thereof (e.g., the processor 1510), such as a booting state, a message state, a charging state, and the like. The motor 1598 may convert an electrical signal into a mechanical vibration and may generate the following effects: vibration, haptic, and the like. A processing device (e.g., a GPU) for supporting a mobile TV may be included in the electronic device 1501. The processing device for supporting the mobile TV may process media data according to the standards of digital multimedia broadcasting (DMB), digital video broadcasting (DVB), MediaFlo™, or the like.

Each of the above-mentioned elements of the electronic device according to various embodiments of the present disclosure may be configured with one or more components, and the names of the elements may be changed according to the type of the electronic device. In various embodiments of the present disclosure, the electronic device may include at least one of the above-mentioned elements, and some elements may be omitted or other additional elements may be added. Furthermore, some of the elements of the electronic device according to various embodiments of the present disclosure may be combined with each other so as to form one entity, so that the functions of the elements may be performed in the same manner as before the combination.

The term "module" used in the present disclosure may indicate, for example, a unit including one or more combinations of hardware, software and firmware. The term "module" may be interchangeably used with the terms "unit", "logic", "logical block", "component" and "circuit". The term "module" may indicate a minimum unit of an integrated component or may be a part thereof. The term "module" may indicate a minimum unit for performing one or more functions or a part thereof. The term "module" may indicate a device that may be implemented mechanically or electronically. For example, the term "module" may indicate a device that may include at least one of an application-specific IC (ASIC) a field-programmable gate array (FPGA), and a programmable-logic device for performing some operations, which are known or will be developed.

At least a part of an apparatus (e.g., modules or functions thereof) or a method (e.g., operations) according to various embodiments of the present disclosure may be, for example, implemented by instructions stored in a computer-readable storage media in the form of a program module. The instruction, if executed by a processor (e.g., the processor 120), may cause the one or more processors to perform a function corresponding to the instruction. The computer-readable storage media, for example, may be the memory 130.

A non-transient computer-readable recording medium may include a hard disk, a floppy disk, a magnetic media (e.g., a magnetic tape), an optical media (e.g., a compact disc ROM (CD-ROM) and a digital versatile disc (DVD), a magneto-optical media (e.g., a floptical disk)), and hardware devices (e.g., a ROM, a random access memory (RAM), or a flash memory). In addition, a program instruction may include not only a mechanical code such as code generated by a compiler but also a high-level language code executable on a computer using an interpreter. The above hardware unit may be configured to operate via one or more software modules for performing an operation of various embodiments of the present disclosure, and vice versa.

A module or a program module according to various embodiments of the present disclosure may include at least one of the above elements, or a part of the above elements may be omitted, or additional other elements may be further included. Operations performed by a module, a program module, or other elements according to various embodiments of the present disclosure may be executed sequentially, in parallel, repeatedly, or in a heuristic method. In addition, some operations may be executed in different sequences or may be omitted. Alternatively, other operations may be added.

A wearable electronic device including a multi-band antenna according to various embodiments of the present disclosure may implement an antenna capable of transmitting/receiving signals in multiple frequency bands by using a conductive appearance of the electronic device as a radiator of an antenna and controlling feeding and ground points for using the conductive appearance as the radiator.

While the present disclosure has been shown and described with reference to various embodiments thereof, it will be understood by those skilled in the art that various changes in form and details may be made therein without departing from the scope of the present disclosure as defined by the appended claims and their equivalents.

What is claimed is:

1. A wearable device, comprising:
an outer housing including a first surface facing a first direction, a second surface facing a second direction opposite to the first direction, and a side surface surrounding a space between the first surface and the second surface, wherein a metal frame is formed on at least a portion of the side surface;
a display wherein at least a portion of which is exposed through the first surface of the outer housing;
a printed circuit board (PCB) interposed between the second surface and the display in an interior of the outer housing;
a communication circuit disposed on the PCB; and
a ground area provided in the PCB,
wherein the metal frame is electrically connected to the communication circuit at a first point of the metal frame and is selectively connected to the ground area at a second point of the metal frame,
wherein the communication circuit is configured to:
transmit and/or receive a signal in a first frequency band by a first electrical path formed if the second point is not connected to the ground area; and
transmit and/or receive a signal in a second frequency band by a second electrical path formed if the second point is connected to the ground area,
wherein the metal frame has a closed loop shape and a side surface of the metal frame is not partitioned,
wherein the metal frame is electrically connected to the ground area at a third point,
wherein a third electrical path is formed between the first point and the third point and is longer than the second electrical path,
wherein the wearable device further comprises:
a metal component disposed in the interior of the outer housing and making contact with and electrically connected to the second point and the third point; and
a switching circuit including a first switch and a second switch configured to control a connection between the metal component and the ground area, and
wherein the metal component and the ground area are electrically connected by the first switch or the second switch.

2. The wearable device of claim 1, further comprising:
an impedance tuner interposed between the second point of the metal frame and the ground area,
wherein the impedance tuner is connected to any one of a port to which an impedance including at least one of an inductor and a capacitor is connected and a port connected to the ground area.

3. The wearable device of claim 1, further comprising:
an impedance tuner interposed between the third point of the metal frame and the ground area,
wherein the impedance tuner is connected to any one of a port to which an impedance including at least one of an inductor and a capacitor is connected and a port connected to the ground area.

4. The wearable device of claim 1, wherein a first end and a second end opposite the first end of the metal component are connected to the metal frame
wherein the first switch is connected to the first end of the metal component, and
wherein the second switch is connected to the second end of the metal component.

5. The wearable device of claim 1, further comprising:
a strap connected to the outer housing, wherein at least a portion of the strap is formed of metal, and
a switch configured to control a connection between the ground area and an area, which is formed of the metal, of the strap,
wherein the wearable device is configured to transmit and/or receive a signal in a frequency band changed if the area, which is formed of the metal, of the strap and the ground area are electrically connected by the switch.

6. The wearable device of claim 1, further comprising:
a switch configured to control a connection between the metal component and the second point.

7. The wearable device of claim 1, further comprising:
a connection member electrically connecting the second point to a conductive pattern of the PCB; and
a switch configured to control a connection between the conductive pattern and the metal component.

* * * * *